(12) United States Patent
Kober et al.

(10) Patent No.: US 6,252,535 B1
(45) Date of Patent: Jun. 26, 2001

(54) METHOD AND APPARATUS FOR ACQUIRING WIDE-BAND PSEUDORANDOM NOISE ENCODED WAVEFORMS

(75) Inventors: Wolfgang Kober, Aurora; John K. Thomas, Louisville, both of CO (US)

(73) Assignee: Data Fusion Corporation, Westminster, CO (US)

( * ) Notice: Subject to any disclaimer, the term of this patent is extended or adjusted under 35 U.S.C. 154(b) by 0 days.

(21) Appl. No.: 09/137,383

(22) Filed: Aug. 20, 1998

Related U.S. Application Data
(60) Provisional application No. 60/087,036, filed on May 28, 1998, provisional application No. 60/056,455, filed on Aug. 21, 1997, and provisional application No. 60/056,228, filed on Aug. 21, 1997.

(51) Int. Cl.[7] .............................. H03M 1/66; H03M 1/12
(52) U.S. Cl. ............................................. 341/155; 341/144
(58) Field of Search .................................... 341/155, 126, 341/144; 704/220, 219, 203, 229

(56) References Cited

U.S. PATENT DOCUMENTS

| | | |
|---|---|---|
| 4,359,738 | 11/1982 | Lewis . |
| 4,665,401 | 5/1987 | Garrard et al. . |
| 4,694,467 | 9/1987 | Mui . |
| 4,737,713 | 4/1988 | Danby et al. . |
| 4,780,885 | 10/1988 | Paul et al. . |
| 4,856,025 | 8/1989 | Takai . |
| 4,893,316 | 1/1990 | Jane et al. . |
| 4,922,506 | 5/1990 | McCallister et al. . |
| 4,933,639 | 6/1990 | Barker . |
| 4,965,732 | 10/1990 | Roy, III et al. . |
| 5,099,493 | 3/1992 | Zeger et al. . |
| 5,109,390 | 4/1992 | Gilhousen et al. . |
| 5,119,401 | 6/1992 | Tsujimoto . |
| 5,151,919 | 9/1992 | Dent . |
| 5,218,619 | 6/1993 | Dent . |
| 5,220,687 | 6/1993 | Ichikawa et al. . |

(List continued on next page.)

FOREIGN PATENT DOCUMENTS

| | | |
|---|---|---|
| 0 558 910 A1 | 1/1993 | (DE) . |
| 4201 439 A1 | 7/1993 | (DE) . |
| 0 610 989 A2 | 1/1994 | (DE) . |
| 4326 843 A1 | 2/1995 | (DE) . |
| 4343 959 A1 | 6/1995 | (DE) . |
| 2280 575 | 1/1995 | (GB) . |
| 7-74687 | 3/1995 | (JP) . |
| WO 93/12590 | 6/1993 | (WO) . |

OTHER PUBLICATIONS

J.G. Ortega, et al.; Analog to Digital and Digital to Analog Conversion Based on Stochastic Logic; 09/95; 995–999.
Christian Halper, et al.; Digital–to–Analog Conversion by Pulse–Cont Modulation Methods; 08/96.
Kun Lin, et al.; Digital Filters for High Performance Audio Delta–Sigma Analog–to–Digital and Digital–to–Analog Conversions; 01/96; 59–63.
M.Y. Frankel, et al.; High–Performance Photonic Analogue–Digital Converter; 12/97; 2096–2097.
Scharf and Friedlander; "Matched Subspace Detectors"; *IEEE Transactions on Signal Processing*; vol. 42, No. 8, Aug. 1994; pp. 2146–2157.
John K. Thomas; Thesis for the Doctor of Philosophy Degree; 1996; 110 pages.

*Primary Examiner*—Patrick Wamsley
(74) *Attorney, Agent, or Firm*—Sheridan Ross P.C.

(57) ABSTRACT

The method and apparatus of the present invention is directed to architectures for signal processing, such as for performing analog-to-digital and digital-to-analog conversions, in which the source signal is decomposed into subband signals by an analysis filter, processed, and the processed subband signals combined to form a reconstructed signal that is representative of the source signal.

37 Claims, 16 Drawing Sheets

U.S. PATENT DOCUMENTS

| | | |
|---|---|---|
| 5,224,122 | 6/1993 | Bruckert . |
| 5,237,586 | 8/1993 | Bottomley . |
| 5,263,191 | 11/1993 | Dickerson . |
| 5,280,472 | 1/1994 | Gilhousen et al. . |
| 5,305,349 | 4/1994 | Dent . |
| 5,325,394 | 6/1994 | Bruckert . |
| 5,347,535 | 9/1994 | Karasawa et al. . |
| 5,353,302 | 10/1994 | Bi . |
| 5,355,533 | 10/1994 | Dickerkson . |
| 5,386,202 | 1/1995 | Cochran et al. . |
| 5,390,207 | 2/1995 | Fenton et al. . |
| 5,394,110 | 2/1995 | Mizoguchi . |
| 5,394,434 | 2/1995 | Kawabe et al. . |
| 5,394,435 | 2/1995 | Weerackody . |
| 5,412,391 | 5/1995 | Lewis . |
| 5,437,055 | 7/1995 | Wheatley, III . |
| 5,440,265 | 8/1995 | Cochran et al. . |
| 5,442,627 | 8/1995 | Viterbi et al. . |
| 5,481,570 | 1/1996 | Winters . |
| 5,491,561 | 2/1996 | Fukuda . |
| 5,513,176 | 4/1996 | Dean et al. . |
| 5,553,098 | 9/1996 | Cochran et al. . |
| 5,568,142 | 10/1996 | Velazquez et al. . |
| 5,602,833 | 2/1997 | Zehavi . |

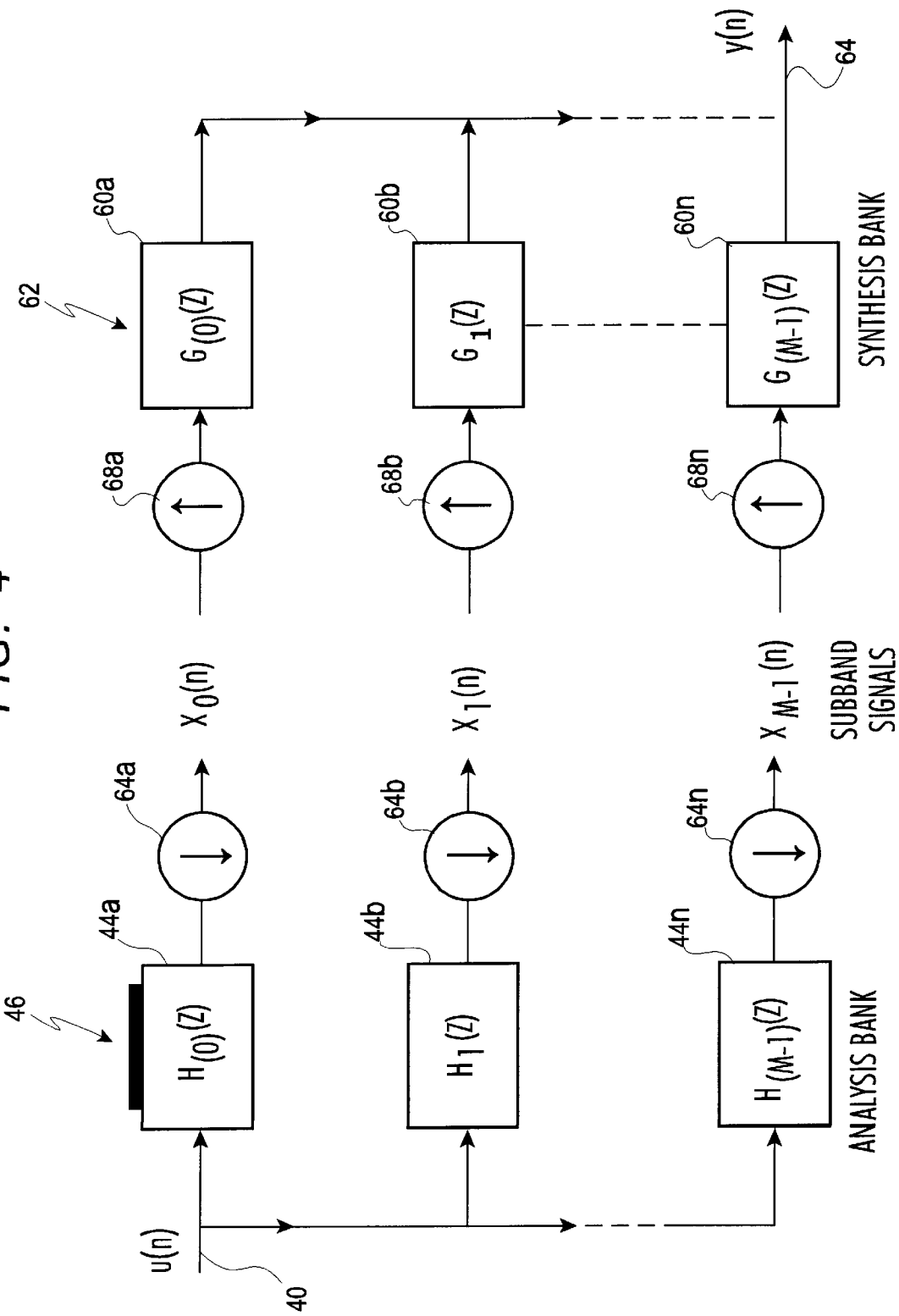

METHOD AND APPARATUS FOR ACQUIRING WIDE-BAND PSEUDORANDOM NOISE ENCODED WAVEFORMS

CROSS REFERENCE TO RELATED APPLICATIONS

The present application claims priority under 35 U.S.C. § 119(e) from U.S. Provisional Application Ser. Nos. 60/087,036 filed May 28, 1998; 60/056,455 filed Aug. 21, 1997; and 60/056,228 filed Aug. 21, 1997, all of which are incorporated herein by this reference.

The U.S. Government has paid-up license in this invention and the right in limited circumstances to require the patent owner to license others on reasonable terms as provided for by the terms of Contract N00014-98-M-0130 awarded by the Office of Naval Research and Contract No. F33615-98-C-1316 awarded by the Air Force Research Laboratory.

FIELD OF THE INVENTION

The present invention relates generally to a method and apparatus for acquiring wide-band random and pseudorandom noise encoded waveforms and specifically to a method and apparatus for acquiring wide-band signals, including deterministic signals, random signals and pseudorandom noise encoded waveforms that divides the waveform into a plurality of subbands prior to signal processing thereof.

BACKGROUND

Analog-to-digital converters are devices that convert real world analog signals into a digital representation or code which a computer can thereafter analyze and manipulate. Analog signals represent information by means of continuously variable physical quantities while digital signals represent information by means of differing discrete physical property states. Converters divide the full range of the analog signal into a finite number of levels, called quantization levels, and assigns to each level a digital code. The total number of quantization levels used by the converter is an indication of its fidelity and is measured in terms of bits. For example, an 8-bit converter uses $2^8$ or 256 levels, while a 16-bit converter uses $2^{16}$ or 65536 levels.

During the conversion process, the converter determines the quantization level that is closest to the amplitude of the analog signal at that time and outputs the digital code that represents the selected quantization level. The rate at which the output is created indicates the speed of the converter and is measured in terms of samples per second (sps) or frequency in Hertz (Hz). As will be appreciated, a larger number of bits and therefore quantization levels equates into a finer representation of the analog signal.

In designing an analog-to-digital converter, there are a number of considerations. In many applications for example it is desirable that the converter has not only a high rate of speed but also a large number of quantization levels or a high degree of fidelity. Such converters are difficult to build and therefore tend to be highly complex and very expensive. The key reason is that conversion errors and the consequential device layout constraints for reducing such errors, both of which can be ignored at slow speeds, can become significant at high speeds. As a result, in existing converters, high fidelity and high speed are commonly mutually exclusive; that is, the higher the converter speed the lower the converter fidelity and vice versa.

SUMMARY OF THE INVENTION

It is an object of the present invention to provide an analog-to-digital converter that has a high fidelity and a high speed. Related objectives are to provide such an analog-to-digital converter that is relatively simple and inexpensive.

The present invention is directed to a method and apparatus for processing signals, particularly wide-band signals, including deterministic signals, random signals, and signals defined by pseudorandom waveforms with a relatively high degree of fidelity and efficiency at a high speed and at a low cost. The invention is particularly useful for processing wideband signal, including signals defined by broadband signals (i.e., signals having a bandwidth of preferably more than about 1 kHz and more preferably more than about 1 GHz).

The signal can be in any suitable form such as electromagnetic radiation, acoustic, electrical and optical.

In one embodiment, the method includes the following steps:

(a) decomposing the analog or digital signal into a plurality of signal segments (i.e., subband signals), each signal segment having a signal segment bandwidth that is less than the signal bandwidth;

(b) processing each of the signal segments to form a plurality of processed signal segments; and (c) combining the processed signal segments into a composite signal that is digital when the signal is analog and analog when the signal is digital. As will be appreciated, the sum of the plurality of signal bandwidths is approximately equivalent to the signal bandwidth. The means for processing the signal segments can include any number of operations, including filtering, analog-to-digital or digital-to-analog conversion, signal modulation and/or demodulation, object tracking, RAKE processing, beamforming, null steering, correlation, interference-suppression and matched subspace filtering.

In a particularly preferred application, the signal processing step (b) includes either analog-to-digital or digital-to-analog conversions. The use of signal segments rather than the entire signal for such conversions permits the use of a lower sampling rate to retain substantially all of the information present in the source signal. According to the Bandpass Sampling Theorem, the sampling frequency of the source signal should be at least twice the bandwidth of the source signal to maintain a high fidelity. The ability to use a lower sampling frequency for each of the signal segments while maintaining a high fidelity permits the use of a converter for each signal segment that is operating at a relatively slow rate. Accordingly, a plurality of relatively inexpensive and simple converters operating at relatively slow rates can be utilized to achieve the same rate of conversion as a single relatively high speed converter converting the entire signal with little, if any, compromise in fidelity.

The means for decomposing the signal into a number of signal segments and the means for combining the processed signal segments to form the composite signal can include any number of suitable signal decomposing or combining devices (e.g., filters, analog circuitry, computer software, digital circuitry and optical filters). Preferably, a plurality or bank of analog or digital analysis filters is used to perform signal decomposition and a plurality or bank of analog or digital synthesis filters is used to perform signal reconstruction. The analysis and synthesis filters can be implemented in any number of ways depending upon the type of signal to be filtered. Filtration can be by, for example, analog, digital, acoustic, and optical filtering methods. By way of example, the filters can be designed as simple delays or very sophisticated filters with complex amplitude and phase responses.

In a preferred configuration, a plurality or bank of analysis and/or synthesis filters, preferably designed for perfect reconstruction, is used to process the signal segments. As will be appreciated perfect reconstruction occurs when the composite signal, or output of the synthesis filter bank, is simply a delayed version of the source signal.

In one configuration, the analysis filters and synthesis filters are represented in a special form known as the Polyphase representation. In this form, Noble identities are can be used to losslessly move the decimators to the left of the analysis filters and the interpolators to the right of the synthesis filters.

In another configuration, noise components in each of the signal segments can be removed prior to signal analysis or conversion in the processing step. The removal of noise prior to analog-to-digital conversion can provide significant additional reductions in computational requirements.

In yet another configuration, a coded signal is acquired rapidly using the above-referenced invention. In the processing step, the signal segments are correlated with a corresponding plurality of replicated signals to provide a corresponding plurality of correlation functions defining a plurality of peaks; an amplitude, time delay, and phase delay are determined for at least a portion of the plurality of peaks; and at least a portion of the signal defined by the signal segments is realigned and scaled based on one or more of the amplitude, time delay, and phase delay for each of the plurality of peaks.

In another embodiment, a method is provided for reducing noise in a signal expressed by a random or pseudorandom waveform. The method includes the steps of decomposing the signal into a plurality of signal segments and removing a noise component from each of the signal segments to form a corresponding plurality of processed signal segments. The means for decomposing the signal can be any of the devices noted above, and the means for removing the noise component includes a noise reducing quantizer, noise filters and rank reduction. Signal reconstruction may or may not be used to process further the processed signal segments. This embodiment is particularly useful in acquiring analog signals.

In yet a further embodiment, a method is provided for combining a plurality of signal segments (which may or may not be produced by analysis filters). In the method, synthesis filtering is performed on each of the plurality of signal segments. The means for performing synthesis filtering can be any of the devices noted above.

A number of differing system configurations can incorporate the synthesis filtering means in this embodiment of the invention. For example, a system can include, in addition to the synthesis filtering means, means for emitting the plurality of signal segments from a plurality of signal sources (e.g., antennas); means for receiving each of the plurality of signal segments (e.g., antennas); and means for converting each of the signal segments from analog format to digital format (e.g., analog-to-digital converter).

In another configuration, the system includes: a plurality of analysis filters to decompose a source signal into a plurality of decomposed signal segments; a plurality of digital-to-analog conversion devices for converting the plurality of decomposed signal segments from digital into analog format to form a corresponding plurality of analog signal segments; a plurality of amplifiers to form a corresponding plurality of signal segments; a plurality of signal emitters for emitting the plurality of signal segments; and a plurality of receptors for receiving the plurality of signal segments.

In yet another configuration, the system includes: a plurality of analysis filters to decompose a source signal into a plurality of decomposed signal segments; a plurality of amplifiers to amplify the decomposed signal segments to form a corresponding plurality of signal segments; a plurality of signal emitters for emitting the plurality of signal segments; and a plurality of receptors for receiving the plurality of signal segments.

In another embodiment, a method is provided in which digital signals are decomposed, processed, and then recombined. Signal processing can include signal correlation (e.g., signal modulation or demodulation), and oblique projection filtration (e.g., as described in copending U.S. patent application Ser. No. 08/916,884 filed Aug. 22, 1997, entitled "RAKE Receiver For Spread Spectrum Signal Demodulation," which is incorporated herein fully by reference).

BRIEF DESCRIPTION OF THE DRAWINGS

FIG. 4 depicts the first embodiment including decimation;

DETAILED DESCRIPTION

Figure 1:
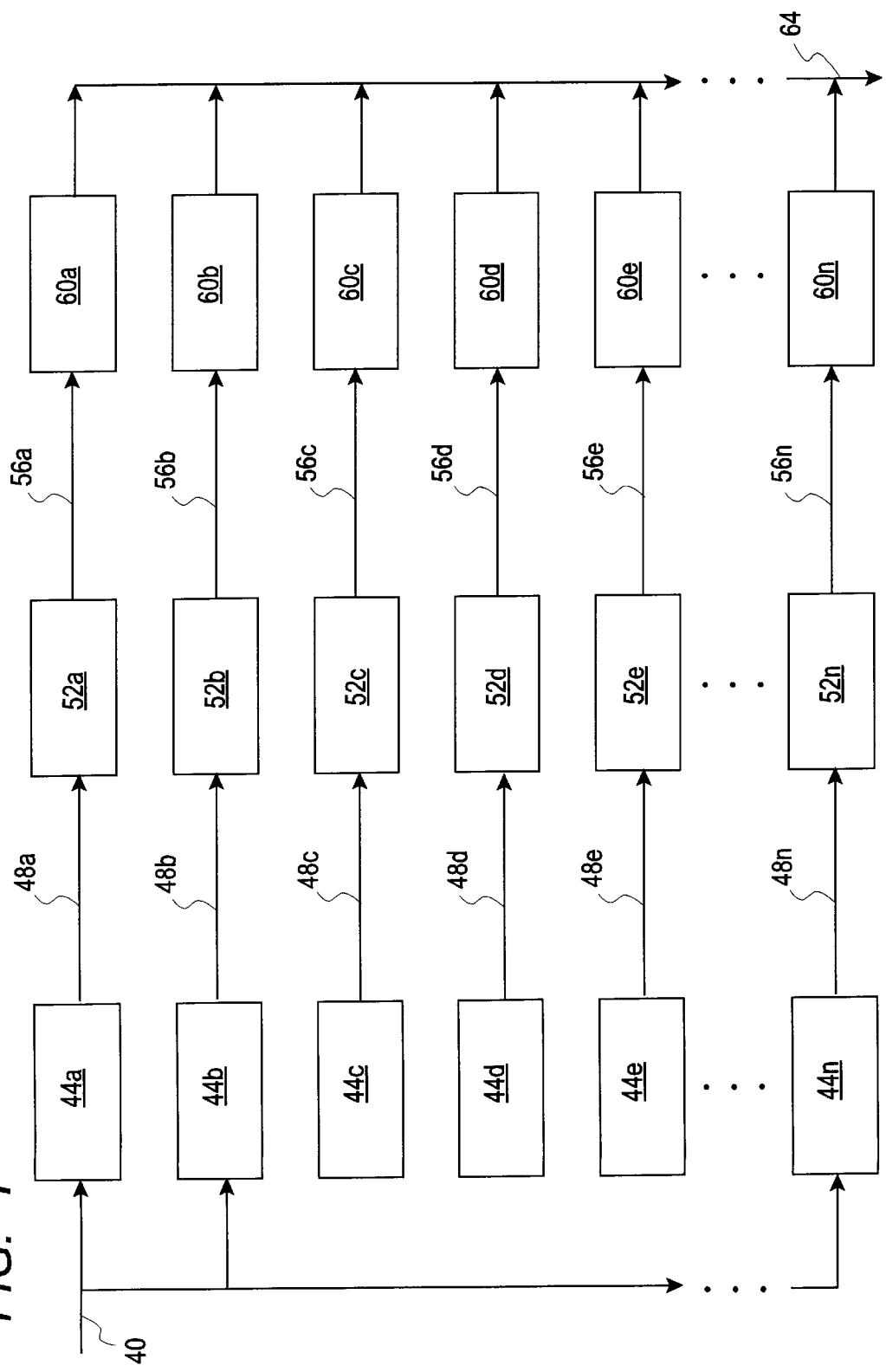
FIG. 1 depicts a first embodiment of the present invention.
Figure 2:
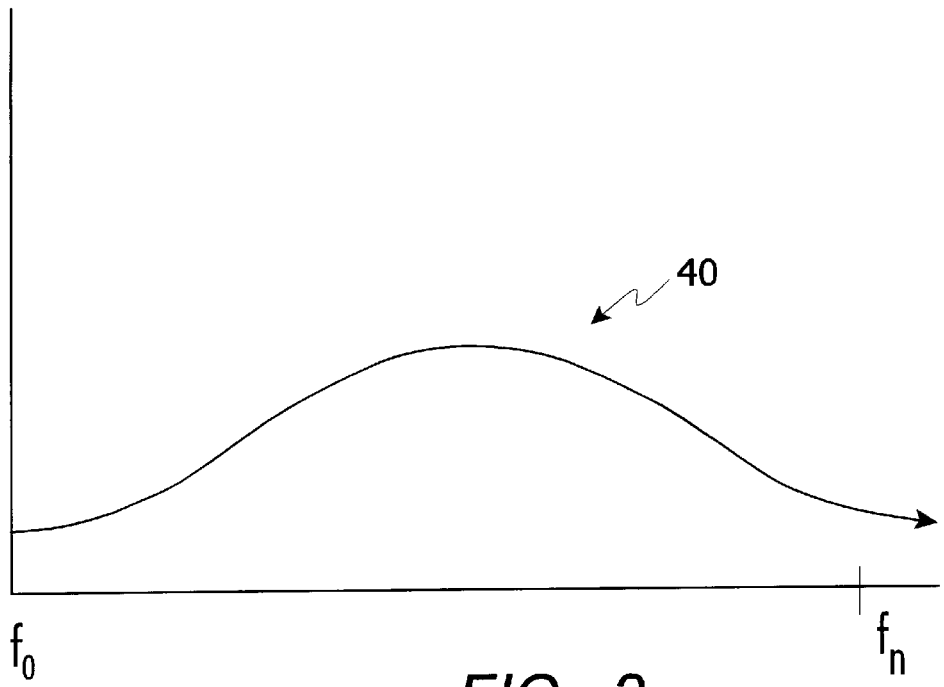
FIG. 2 depicts an analog signal.
Figure 3:
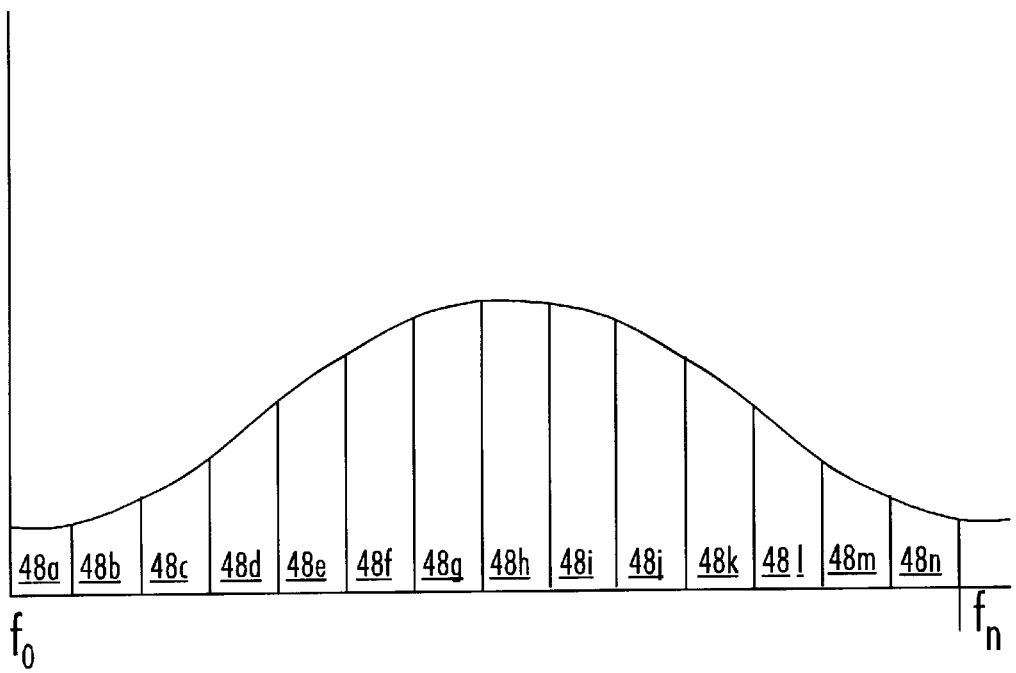
FIG. 3 depicts the analog signal of FIG. 2 divided up into a plurality of signal segments.

Referring to FIG. 1, an embodiment of the present invention is illustrated. As can be seen from FIGS. 1 and 2, a wideband, pseudorandom or random signal 40 (shown in FIG. 2) is passed to a bank or plurality of analysis filters 44a–n. The signal 40 has a frequency band or domain, $F_s$, having frequency bounds, $f_o$ (lower) and $f_n$ (upper), and therefore a bandwidth of $f_o$–$f_n$ (FIG. 2). The bandwidth commonly is at least about 1 kHz, more commonly at least about 1 GHz. Each of the analysis filters 44a–n pass only a portion of the frequency band of the signal to form a plurality of subband signals 48a–n, or time frequency components, characterized by discrete portions of the frequency band, $F_s$, of the signal 40 (FIG. 3). As will be appreciated, the summation of the individual frequency bandwidths of all of the subband signals 48a–n is substantially the same as the bandwidth of the signal 40 (FIG. 3). The various subband signals 48a–n are processed 52a–n independently as described below to form a corresponding plurality of processed signal segments 56a–n. The processed signal segments 56a–n are passed to a bank or plurality of synthesis filters 60a–n and combined to form a composite signal 64. Generally, the signal 40 is analog or digital and, when the signal 40 is analog, the composite signal 64 is digital, and, when the signal 40 is digital, the composite signal 64 is analog.

The analysis and synthesis filters 44a–n and 60a–n can be in any of a number of configurations provided that the filters pass only discrete, or at most only slightly overlapping, portions of the frequency domain of the signal 40. It is preferred that the frequency bands of the subband signals overlap as little as possible. Preferably, no more than about 5% and more preferably no more than about 1% of the frequency bands of adjacent subband signals overlap.

The filters can be analog or digital depending on the type of signal 40 or the processed signal segments 56a–n. Examples of suitable analog analysis and synthesis filters include a suitably configured bandpass filter formed by one or more low pass filters, one or more high pass filters, a combination of band reject and low pass filters, a combination of band reject and high pass filters, or one or more band reject filters. Digital analysis and synthesis filters are typically defined by software architecture that provides the desired filter response.

In a preferred configuration shown in FIG. 4, the signal 40 is decomposed by the analysis filter bank 46 (which includes analog or digital analysis filters $H_k(z)$ 44a–n) into subband signals which are each sampled by a downsampler 64a–n performing an M-fold decimation (i.e., taking every $M^{th}$ sample), and the sampled subband signals are further sampled after signal processing by an up-sampler 68a–n (and/or expander (which fills in L–1 zeros in between each sample)) and the further sampled subband signals are combined by a synthesis filter bank 62 (that includes analog or digital synthesis filters $G_k(z)$ 60a–n). The sampled subband signals, denoted by $x_o(n)$, $x_1(n)$, ... $x_{m-1}(n)$, are the outputs of the N-band analysis filter bank and the inputs to the N-band synthesis filter bank. As a result of decimation, the subband signals are 1/N the rate of the input rate of the signal 40.

Preferably, the analysis and synthesis filters are perfect reconstruction filters such that the composite signal 64 is a delayed version of the signal 40 (i.e., y(n)=u(n–L) where y(n) is the composite signal, u(n) is the signal, and L is time of delay). Using perfect reconstruction filters, the subband signals 48a–n can be downsampled without any loss in fidelity of the output signal. This downsampling is permissible because the subband signals are of narrow bandwidth and the consequence of the downsampling is that any processing application 52a–n that is embedded in the subbands can run at significantly reduced rates.

Figure 21:
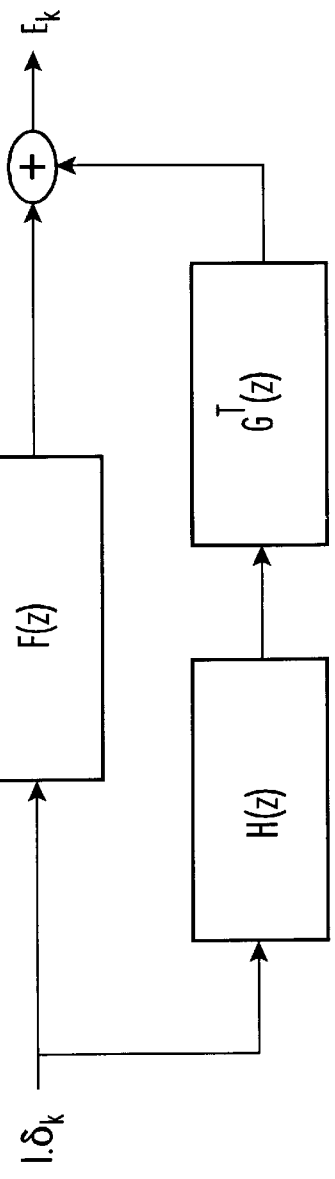
FIG. 21 depicts a least squares, multiple input multiple output filter design problem.
Figure 12:
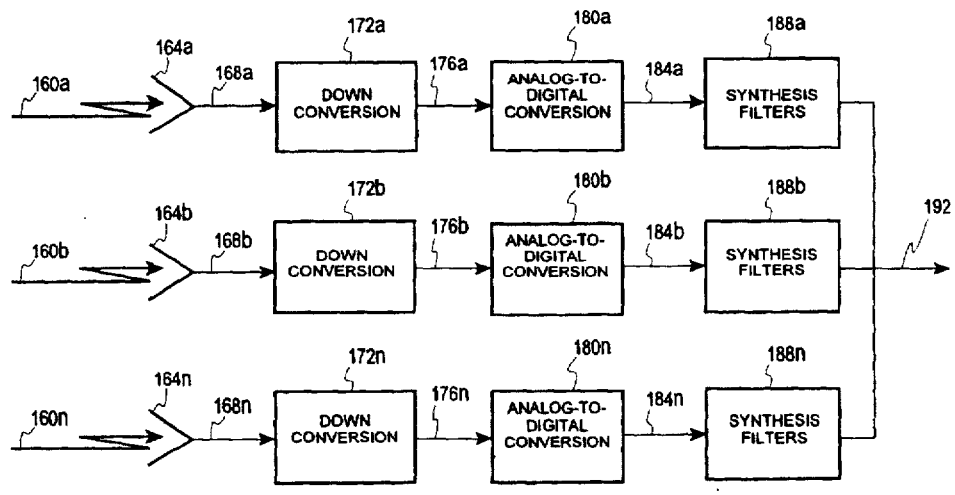

As will be appreciated, a perfect reconstruction filter system can be formed by a number of different methods, including quadrature mirror filter techniques. A preferred technique for designing a filter bank is known as a least squares multiple input multiple output filter design notation. According to this technique, which is illustrated in FIG. 21, a rational transfer matrix defining one of the filter banks is known, i.e., either H(z) or $G^T(z)$, along with a rational transfer matrix F(z) defining the ideal output of the filter banks. Assuming that H(z) and F(z) are the known rational transfer matrices, the unknown rational transfer matrix, $G^T(z)$, is determined by the following equation:

$$G^T(z)=[F(z)U^T(z^{-1})]_+H_0^{-1}(z)$$

where $H(z)=H_0(z)U(z)$ ; $[H_0(z)$ is the minimum phase equivalent of $H(z)]$ $U(z)U^T(z^{-1})=I$; Paraunitary $[F(z)U^T(z^{-1})]_+$: Causal part of $F(z)U^T(z^{-1})$ As will be appreciated if $G^T(z)$ were known and H(z) were unknown, then the equation would be solved for H(z) rather than $G^T(z)$, and $G^T(z)$ would be decomposed into the following:

$$G^T(z)=G_o^T(z)U(z)$$

where $G_o^T(z)$ is the minimum phase equivalent of $G^T(z)$.

In a preferred embodiment, the rational transfer matrices of the analysis and/or synthesis filters are mathematically expressed in a polyphase filter representation. Exemplary equations defining the decomposition of the signal 40 by the analysis filters 44a–n include the following:

$$H(z) = \sum_{l=0}^{M-1} z^l E_l(z^M)$$

where

M is the number of subbands (which is the same as the number of analysis filters in the analysis filter bank; l is the subband designation);

$$E_l(z^M) = \sum_{n=-\infty}^{\infty} e_l(n)z^{-n}$$

$e_l(n)=h(Mn+l)$, $0 \leq l \leq M-1$ (known as a Type 1 polyphase filter representation) and $$H(z) = \sum_{l=0}^{M-1} z^{-(M-1-l)} R_l(z^M)$$

where $R_1(z^M)=E_{M-1-l}(z)$ (known as Type 2 polyphase filter representation). As will be appreciated, other techniques exist for expressing a rational transfer matrix defining a filter system including impulse response and filter description.

Figure 5A:
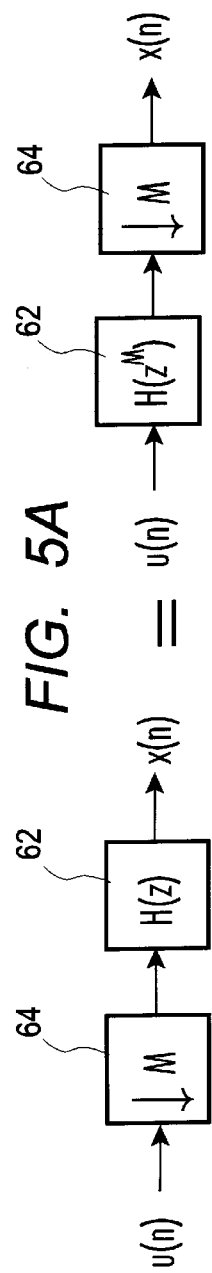
FIGS. 5A and 5B depict noble identities.

Noble identities can be used to losslessly move the decimators to the left of the analysis filters and the L-fold up-sampler and/or expander to the right of the synthesis filters. In this manner, the analysis and synthesis filters operate on lower rate data, thereby realizing significant computational savings. The noble identities include:

Identity I: Decimation by M followed by filtering defined by the mathematical function H(z) is equivalent to filtering by $H(z^M)$ followed by decimation by M (FIG. 5A).

Figure 5B:
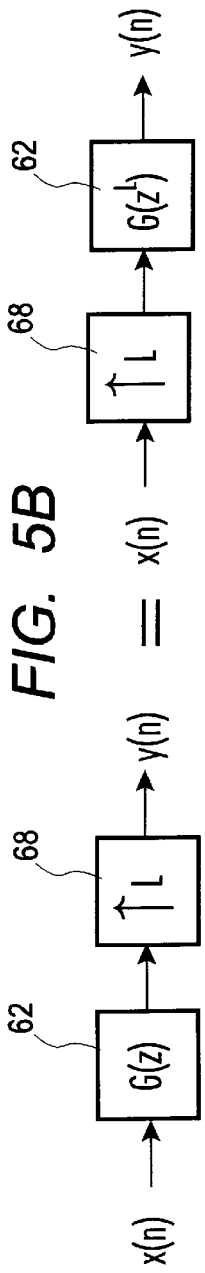

Identity II: Filtering by G(z) followed by an upsampling by L is equivalent to upsampling by L followed by filtering by $G(z^L)$ (FIG. 5B).

By way of example, assume H(z) defines an order N finite impulse response (FIR) digital analysis filter with impulse response h(n), M=2, u(n) is the source signal and X(n) is the subband signal. Using the type 1 polyphase representation above, H(z) is decomposed to yield the following:

$$H(z)=H_o(z^2)+H_1(z^2)$$

Figure 6:
FIG. 6 depicts a polyphase filter representation.
Figure 7:
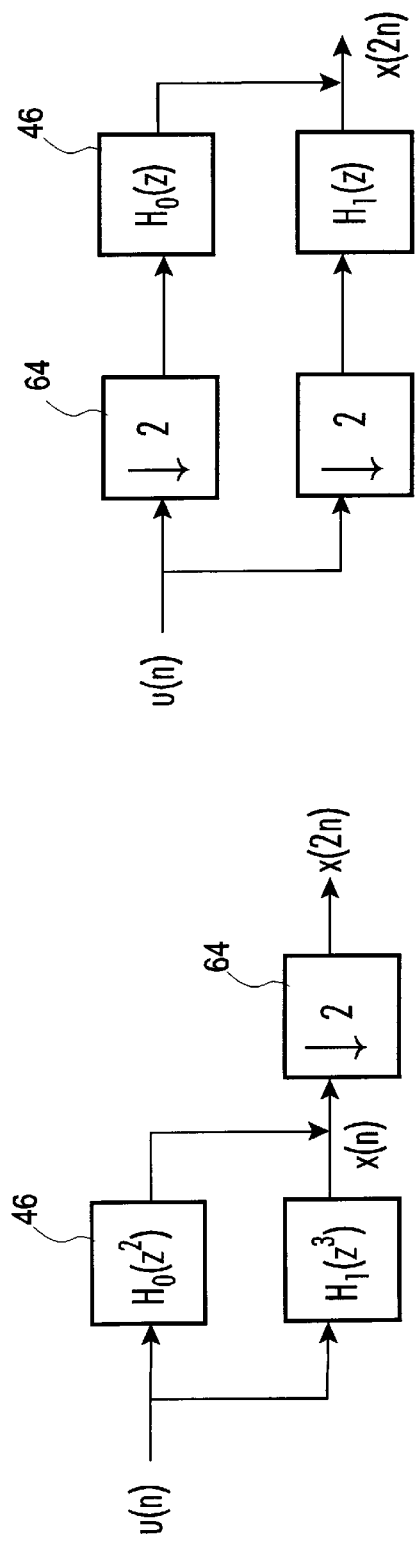
FIG. 7 depicts a polyphase filter representation with noble identities.

Based on the foregoing, FIG. 6 is a polyphase representation based implementation of H(z) without noble identities and FIG. 7 is a polyphase representation-based implementation of the analysis filters H(z) using noble identities to move the decimators ahead of the analysis filters. In this configuration, $H_o(z^2)$ and $H_1(z^2)$ are FIR filters of order $n_o+1$ and $n_1+1$, where $N=n_o+n_1+1$. $H_o(z^2)$ and $H_1(z^2)$ operate at half the rate as compared to H(z) and therefore have two units of time in which to perform all the necessary computations, and the components are continually active (i.e., there are no resting times). Accordingly, there is an M-fold reduction in the number of multiplications and additions per unit of time when using both polyphase representation and the noble identities to implement an M-fold decimation filter.

Figure 8:
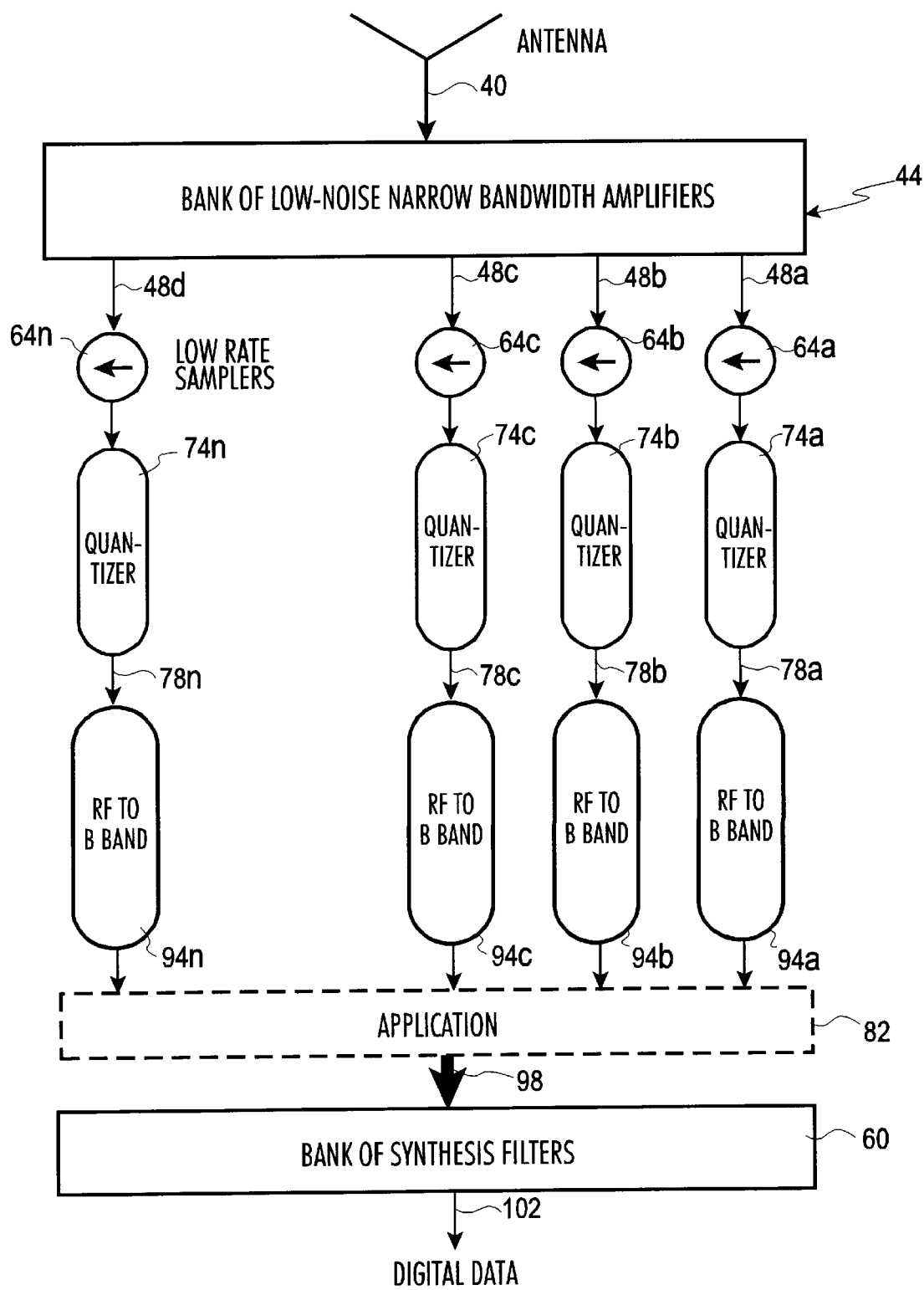
FIG. 8 depicts another embodiment of the present invention.
Figure 9:
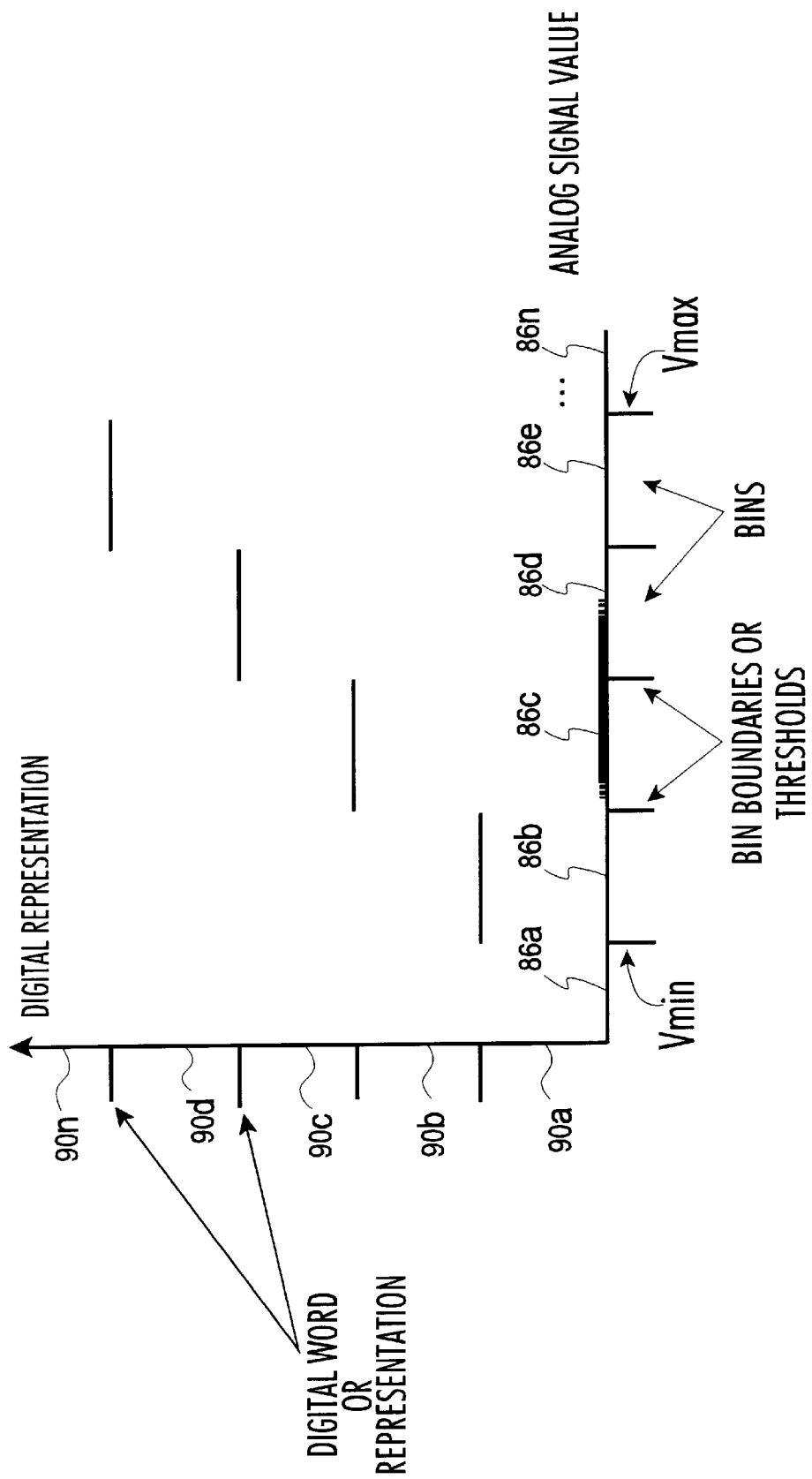
FIG. 9 depicts the quantization process of the quantizers in FIG. 8.

Subband signal processing can take a variety of forms. In one embodiment shown in FIG. 8 which depicts a receiver and antenna architecture, the source signal 40 and subband signals 48a–n are in analog form and a plurality of quantizers or analog-to-digital converters are used to convert the subband signals 48a–n to digital form before further processing 82 (e.g., correlation for encoded subband signals, subband signal digital beamforming in multiple antenna systems, etc.) and/or synthesis of the digital subband signals 78a–n is performed. As noted above, the subband signals 48a–n are preferably sampled by each of the decimators or downsamplers 64a–n at a rate of at least about twice the bandwidth of the corresponding subband signal 48a–n to maintain fidelity. As shown in FIG. 9, each quantizer, or analog-to-digital converter, 74a–n determines the digital word or representation 90a–n that corresponds to the bin 86a–n having boundaries capturing the amplitude of the analog subband signal at that time and outputs the digital word or representation that represents the selected quantization level assigned to the respective bin. The digital subband signals 78a–n are converted 94a–n from radio frequency (RF) to base band frequency and optionally subjected to further signal processing 60. The processed subband signals 98 are formed into a digital composite signal 102 by the synthesis filter bank 60.

To provide increased accuracy, noise rejecting quantizers can be utilized as the quantizers 74a–n. As will be appreciated, a noise rejecting quantizer assigns more bits to the portions of the subband signal having less noise (and therefore more signal) and fewer bits to the noisy portion. This selective assignment is accomplished by adaptively moving the bin boundaries so as to narrow the bin width (thereby increasing quantization fidelity). An example of a design equation for a Lloyd-Max noise rejecting quantizer is as follows:

$$t_k = \frac{x_{k-1}+x_k}{2} + \frac{\delta^2(x_k)-\delta^2(x_{k-1})}{2(x_k-x_{k-1})}; \quad x_k = e_k - \frac{1}{2}\frac{d\delta^2(x_k)}{dx_k}$$

where:
x is the signal to be quantized;
N is the number of quantization levels;
k is signal identifier;
σ is the noise covariance.

The mean squared quantization error (MSE) $\zeta^2$ is as follows:

$$\zeta^2 = E(x-\hat{x})^2 = E_x^2 + \sum_{k=0}^{N-1}[\sigma^2(x_k)+x_k^2-2x_k e_k]P_k$$

where:

$\{x_k\}_o^{N-1}$ are the representation points;

$\{c_k\}_o^{N-1}$ are the quantization bins;

$\{t_k\}_o^{N-1}$ are the bin thresholds;

$f_y(y)$ is the probability density function of y;

y=x+n, where x is the signal component and n the noise component;

$$e_k = Ex|y \in C_k] = 1/P_k \int_{t_k}^{t_{k+1}} E[x|y=\alpha]fy(\alpha)d\alpha; \quad \text{and}$$

$$P_k = P[y \in C_k] = \int_{t_k}^{t_{k+1}} fy(\alpha)d\alpha$$

The LM equations require that the bin thresholds be equidistant from the representation points and that each representation point be the conditional mean of x in the corresponding quantization bin. As will be appreciated, a Lloyd-Max (LM) quantizer substantially minimizes the mean squared error between the discrete approximation of the signal and its continuous representation.

The noise covariance, δ, can be estimated by linear mean squared error estimation techniques. Linear mean squared error estimates are characterized by the following equation:

$$\hat{X} = Ty = R_{xy}R_{yy}^{-1}y$$

where T is the Wiener filter, $R_{xy}$ is the cross covariance between x and y and $R_{yy}$ is the covariance of y.

$R_{xy}$ and $R_{yy}$ are unknown and require estimation. A number of techniques can be used to estimate $R_{xy}$ and $R_{yy}$, including an adaptive Wiener filter (e.g., using the linear mean squared algorithm), direct estimation, sample matrix inversion and a recursive, adaptive Wiener filter, with a recursive, adaptive Wiener filter being more preferred.

The recursive, adaptive Wiener filter is explained in Thomas, J. K., *Canonical Correlations and Adaptive Subspace Filtering*, Ph.D Dissertation, University of Colorado Boulder, Department of Electrical and Compute Engineering, pp. 1–110, June 1996. which is incorporated herein by reference in its entirety. In a recursive, adaptive Wiener filter assume $\hat{T}_M$ denotes the filter when M measurements of X and Y are used. Then $\hat{T}_M$ is the adaptive Wiener filter $$\hat{T}_M = X_M Y_{M^*}(Y_M Y_{M^*})^{-1} = \hat{R}_{xy}\hat{R}_{yy}^{-1},$$

$X_M$=[$x_1 x_2 \ldots x_M$]; $X_{M+1}$=[$x_M x$]

$Y_M$=[$y_1 y_2 \ldots y_M$]; $Y_{M+1}$=[$y_M y$]

If another measurement of x and y is taken, and one more column is added to $X_M$ and $Y_M$ to build $\hat{T}_{M+1}$:

$$\hat{T}_{M+1}=X_M Y_{M^*}\hat{R}_{M+1}^{-1}+xy^*\hat{R}_{M+1}^{-1}$$

The estimate of $X_{M+1}$ is $\hat{X}_{M+1}$ $$\hat{X}_{M+1} = \hat{T}_{M+1} Y_{M+1}$$

Using the estimate of $X_{M+1}$, one can read off $\hat{x}_{M+1}$, which is the estimate of x:

$$\hat{x}_{M+1} = \frac{1}{1+r^2} \tilde{x}_M + \frac{r^2}{1+r^2}$$

where $r^2 = y^* \hat{R}_M^{-1} y$ and $\tilde{x}_{M+1} = \hat{T}_M y$.

Based on the above, when one observes y, the best estimate of the unknown x is $\tilde{x}$, with corresponding estimation error $\tilde{E}_{M+1}$ and covariance $\tilde{Q}_{M+1}$. If the unknown x becomes available after a delay, then $\tilde{x}_{M+1}$ can be updated to $\hat{x}_{M+1}$ with error covariance $\hat{E}_{M+1}$ and covariance $\hat{Q}_{M+1}$. The two covariances are related by the following formula:

$$\tilde{Q}_{M+1} = \hat{Q}_{M+1} + \frac{r^2}{1+r^2} xx^*$$

Figure 19:
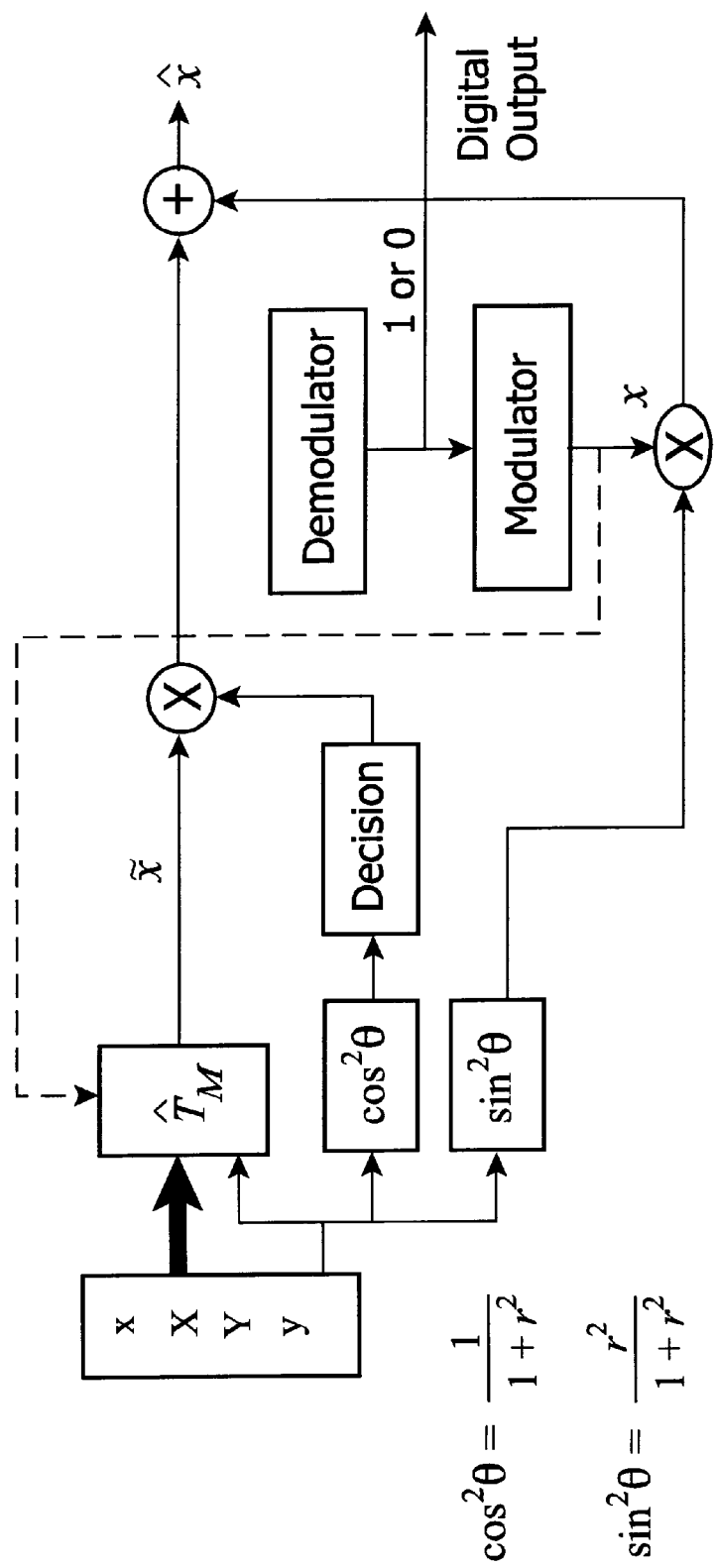
FIG. 19 depicts a digital communications example of a recursive, adaptive Wiener filter.

By way of example and as illustrated in FIG. 19, consider a digital communication application in which the modulation scheme involves transmitting $x_0$ and $x_1$ when bits 0 and 1 are to be sent. During the setup of the communication link, the transmitter sends a known bit sequence across the unknown channel. Let $X_M$ be the matrix of signals that correspond to the known bit sequence. The receiver observes $Y_M$, which is the channel filtered and noise corrupted version of $X_M$. Since the receiver knows the bit pattern, and therefore $X_M$, it is able to build $\hat{T}_M$. Therefore we refer to $X_M$ and $Y_M$ as the training set.

Once the communication link is established, the transmitter sends a signal x, which corresponds to a data bit. The receiver observes the corresponding y and uses it to estimate x using $\hat{T}_M$:

$$\tilde{x} = \hat{T}_M y$$

The receiver determines $r^2$, $\cos^2\theta$ and $\sin^2\theta$.

When $\cos^2\theta$ is approximately equal to 1, $\tilde{x}$ is deemed to be a good estimate of x and is used to decide if a 1 or 0 was sent. If, however, $\cos^2\theta \ll 1$, then the estimate $\tilde{x}$ is scaled by $\cos^2\theta$, as required by equation 14, before it is used to decide if a 1 or 0 was sent. Once the decision of 1 or 0 is made, the true x is known and can be used to build $\hat{x}$ as required by equation 14 above and as illustrated in FIG. 19. The x and y are also added to the training set to update $\hat{T}_M$.

Figure 10:
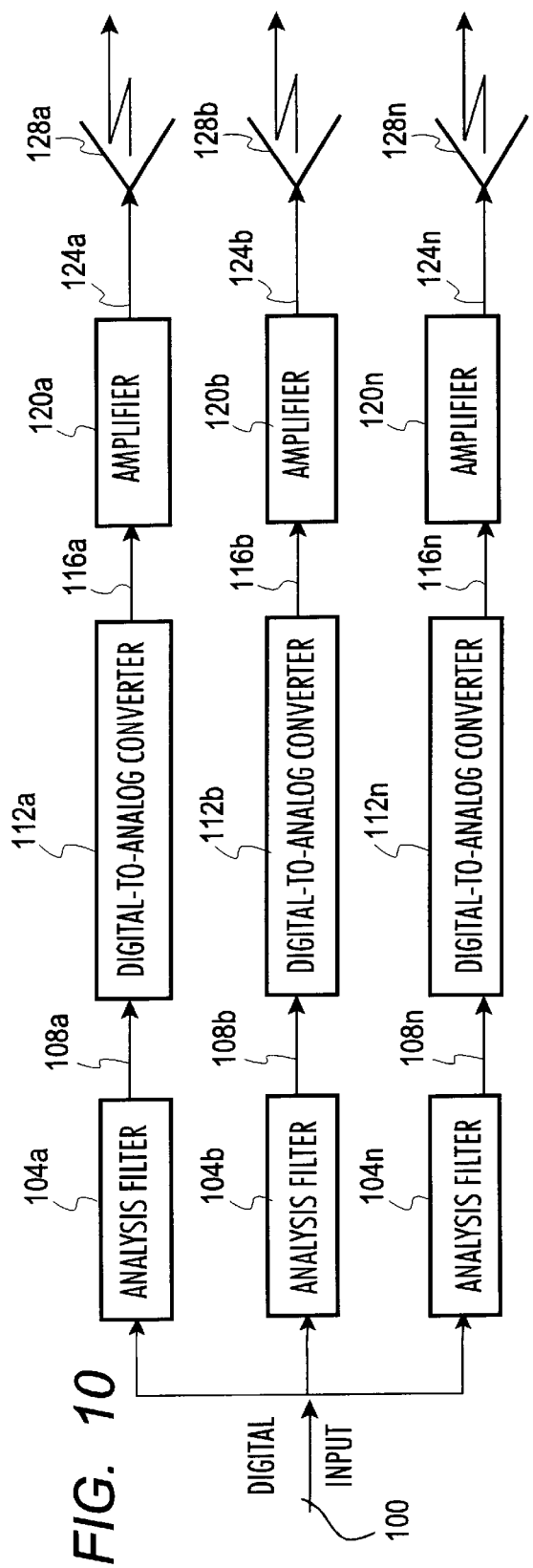
FIG. 10 depicts a subband digital transmitter.

In another embodiment, the source signal 40 is digital and the analysis filters are therefore digital, signal processing is performed by a digital-to-analog converter, and the synthesis filters are analog. FIG. 10 depicts a subband digital transmitter according to this embodiment. The signal 100 is in digital format and is transmitted to a bank of analysis filters 104a–n to form a plurality of digital subband signals 108a–n; the digital subband signals 108a–n are processed by digital-to-analog converters 112a–n to form analog subband signals 116a–n; the analog subband signals 116a–n are amplified by amplifiers 120a–n to form amplified subband signals 124a–n; and the amplified subband signals 124a–n transmitted via antennas 128a–n.

Figure 11:
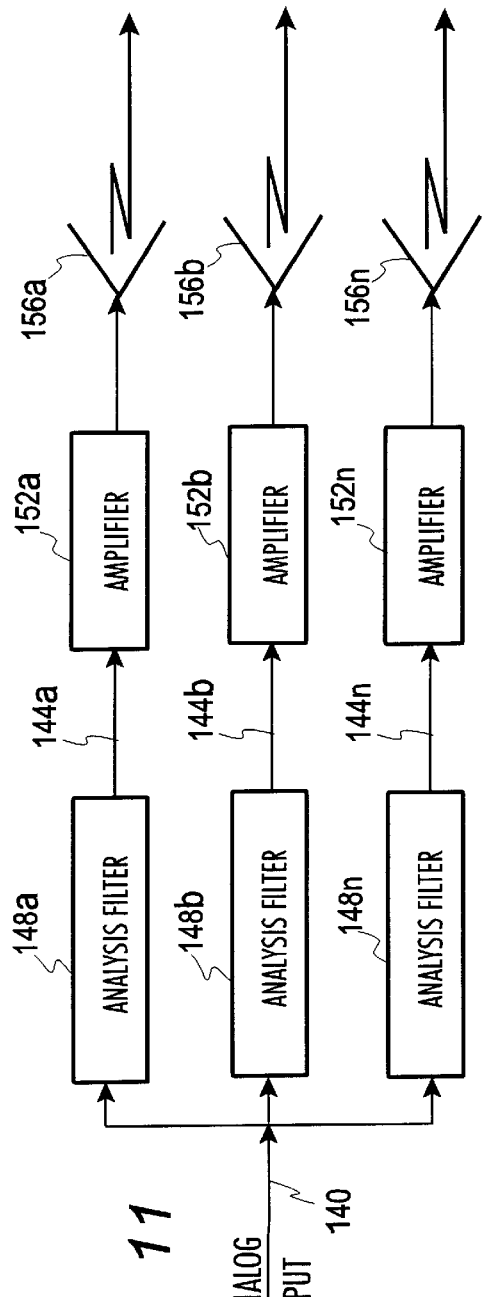
FIG. 11 depicts a subband analog transmitter.

In another embodiment shown in FIG. 11, a subband analog transmitter is depicted where the signal 140 is analog and not digital. The signal 140 is decomposed into a plurality of analog subband signals 144a–n by analog analysis filters 148a–n and the analog subband signals 144a–n amplified by amplifiers 152a–n, and the amplified subband signals transmitted by antennas 156a–n.

Figure 12:
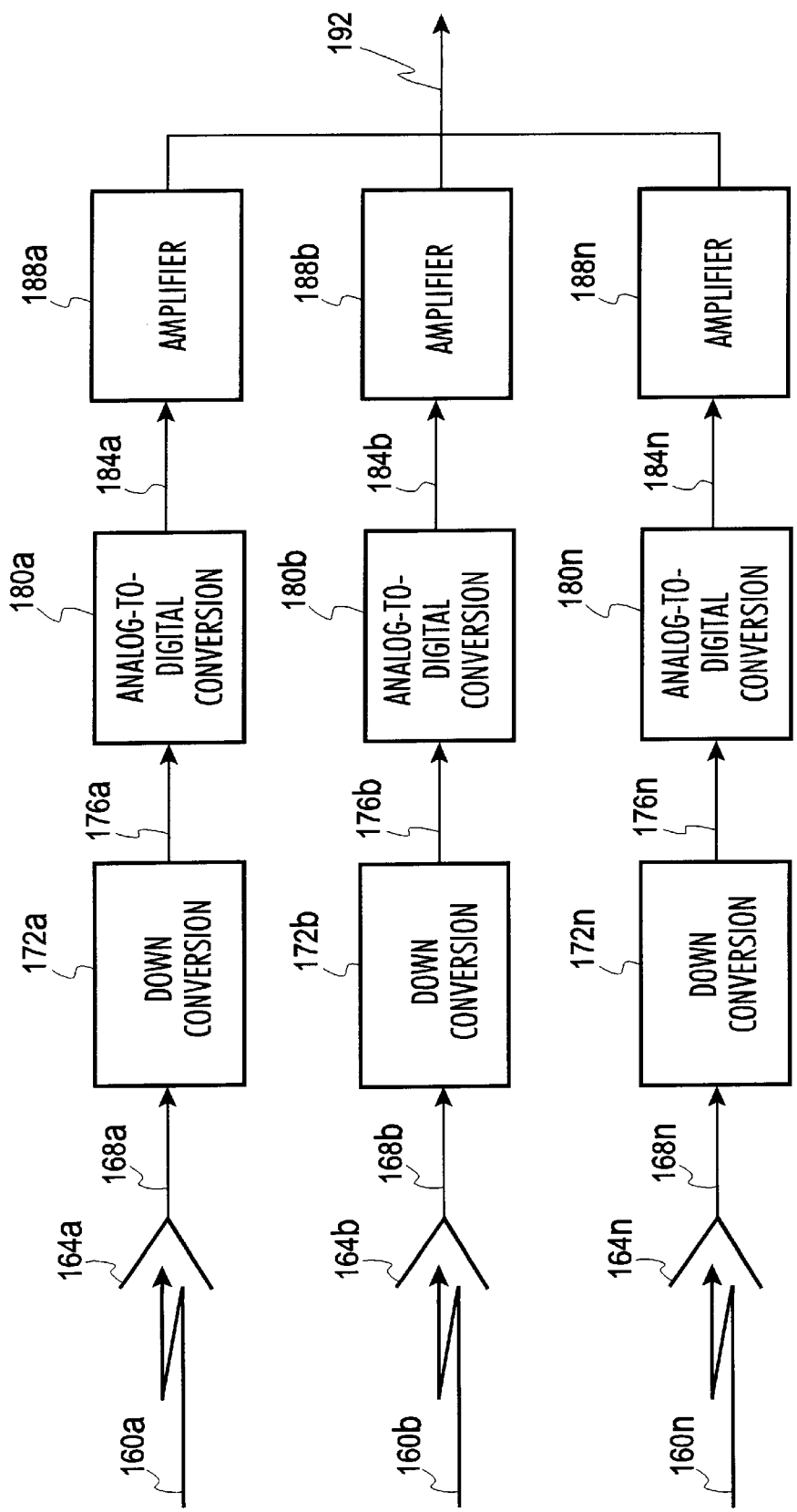
FIG. 12 depicts a subband receiver.

In yet another embodiment shown in FIG. 12, a subband receiver is depicted that is compatible with the subband analog transmitter of FIG. 11. Referring to FIG. 12, a plurality of subband signals 160a–n are received by a plurality of antennas 164a–n, the received subband signals 168a–n down converted from radio frequency to baseband frequency by down converters 172a–n; the down converted subband signals 176a–n which are in analog form are converted by quantizers 180a–n from analog to digital format; and the digital subband signals 184a–n combined by synthesis filters 188a–n to form the digital composite signal 192.

In any of the above-described transmitter or receiver embodiments, when the subband signals are encoded waveforms such as Code Division Multiple Access (CDMA) or precision P(Y) GPS code signals, the subband signals can be encoded or decoded to realize computational savings. In a receiver, for example, the subband signals are correlated with a replica of the transmitted signal prior to detection. The correlation process can be performed before or after synthesis filtering or before conversion to digital (and therefore in analog) or after conversion to digital (and therefore in digital). The approach is particularly useful for the rapid, direct acquisition of wideband pseudorandom noise encoded waveforms, like CDMA type signals and the P(Y) GPS code, in a manner that is robust with respect to multipath effects and wide-band noise. Because the M-subband signals have narrow bandwidths and therefore can be searched at slower rates, correlation of the subband signals rather than the signal or the composite signal can be performed with over an M-fold reduction in computation and therefore reduce the individual component cost.

Figure 13:
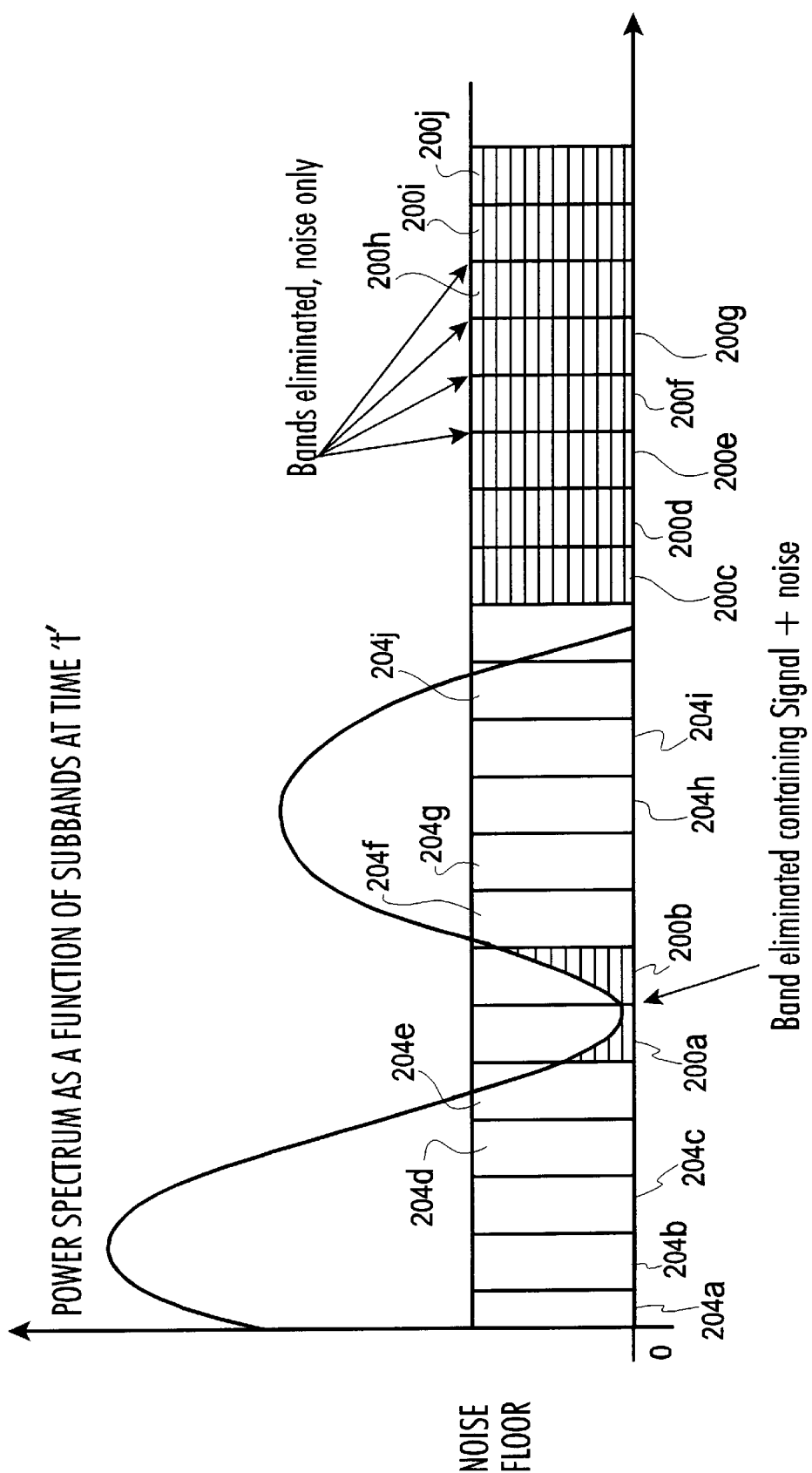
FIG. 13 depicts rank reduction for noise filtering.

To provide further reductions in computational requirements, the number of subbands requiring correlation at any trial time and Doppler frequency can be reduced. The pseudorandom nature of the coded signals implies that a coded signal will only lie in certain known subbands at any given time. According to the rank-reduction principle and as illustrated by FIG. 13, subbands 200a–j outside of the subbands 204a–j containing the coded signal can be eliminated to reduce the effects of wide-band noise in the acquisition and/or tracking of pseudorandom signals. This is accomplished by eliminating any subband in which the noise component exceeds the signal component (i.e., the SNR is less than 1). Such an elimination increases the bias squared, which is the power of the signal components that are eliminated, while drastically decreasing the variance, which is the power of the noise that was eliminated. In this manner, the mean squared error between the computed correlation function and the noise-free version of the correlation function is significantly reduced.

Figure 14:
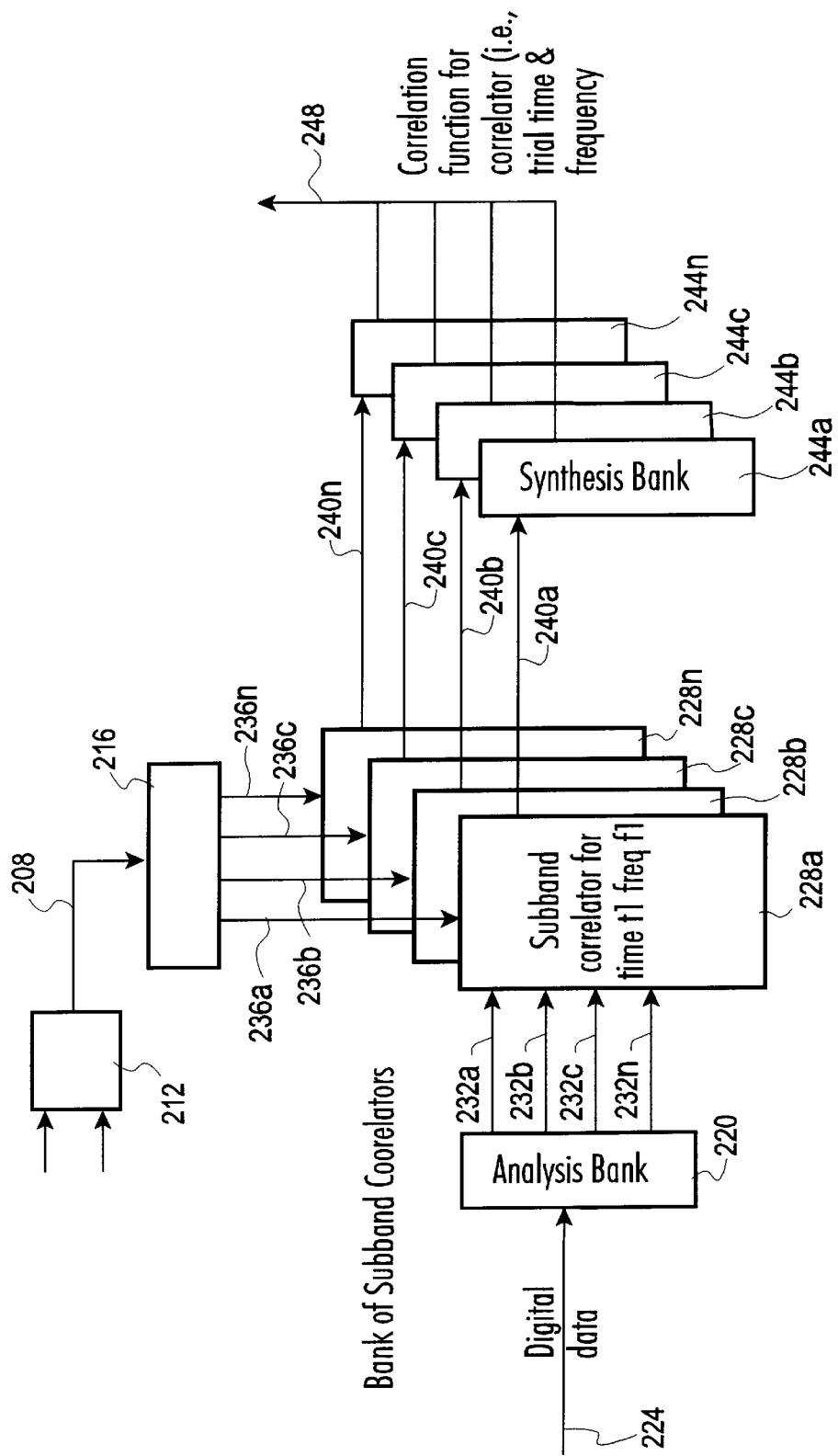
FIG. 14 depicts another embodiment of the present invention.

As shown in FIG. 14 to perform the correlation in the subband signals in GPS, CDMA, and other pseudorandom or random waveform applications, the replicated code 208 from the code generator 212 must be passed through an analysis filter bank 216 that is identical to the analysis filter bank 220 used to decompose the signal 224. Because the correlation must be performed for different segments of the replicated code 208, each indexed by some start time, this decomposition is necessary for all trial segments of the replicated code 208. A plurality of subband correlators 228a–n receive both the subband signals 232a–n and the replicated subband signals 236a–n and generate a plurality of subband correlation signals 240a–n. The subband correlation signals 240*a–n* are provided by the following equation:

$$q_{m,n}^{(i)}(j) = \sum_{k=1}^{N} x_m(k+j) p_n^{(i)}(k)$$

where:
- q(k) is the subband correlation signal;
- $p_n^{(i)}(k)$ is the component of the $i^{th}$ trial segment of the P(Y) code in the $n^{th}$ subband;
- $x_m(k)$ is the component of the measurement that lies in the $m^{th}$ subband;
- N is the number of samples over which the correlation is performed.

The subband correlation signals 240*a–n* are upsampled and interpolated by the synthesis filters 244*a–n* and then squared and combined. The resulting composite signal 248 is the correlation function that can be further processed and detected.

After the subband correlation signals 240*a–n* are generated, the signals, for example, can be processed by a RAKE processor, which is commonly a maximal SNR combiner, to align in both time and phase multipath signals before detection and thereby provide improved signal-to-noise ratios and detection performance. As will be appreciated, a signal can be fragmented and arrive at a receiver via multiple paths (i.e., multipath signals) due to reflections from other objects, particularly in urban areas. The formation of a number of multipath signals from a source signal can degrade the correlation peaks, which contributes to the degradation of the detections. The RAKE processor determines the time and phase delays of these multipath signals by searching for correlation peaks in the correlation function and identifying the time and phase delays for each of the peaks. The RAKE processor then uses the time and phase delay estimates to realign the multipath signals so that they can add constructively and enhance the correlation peaks. The peak enhancement improves detection because of the increase in signal-to-noise ratio.

Figure 15:
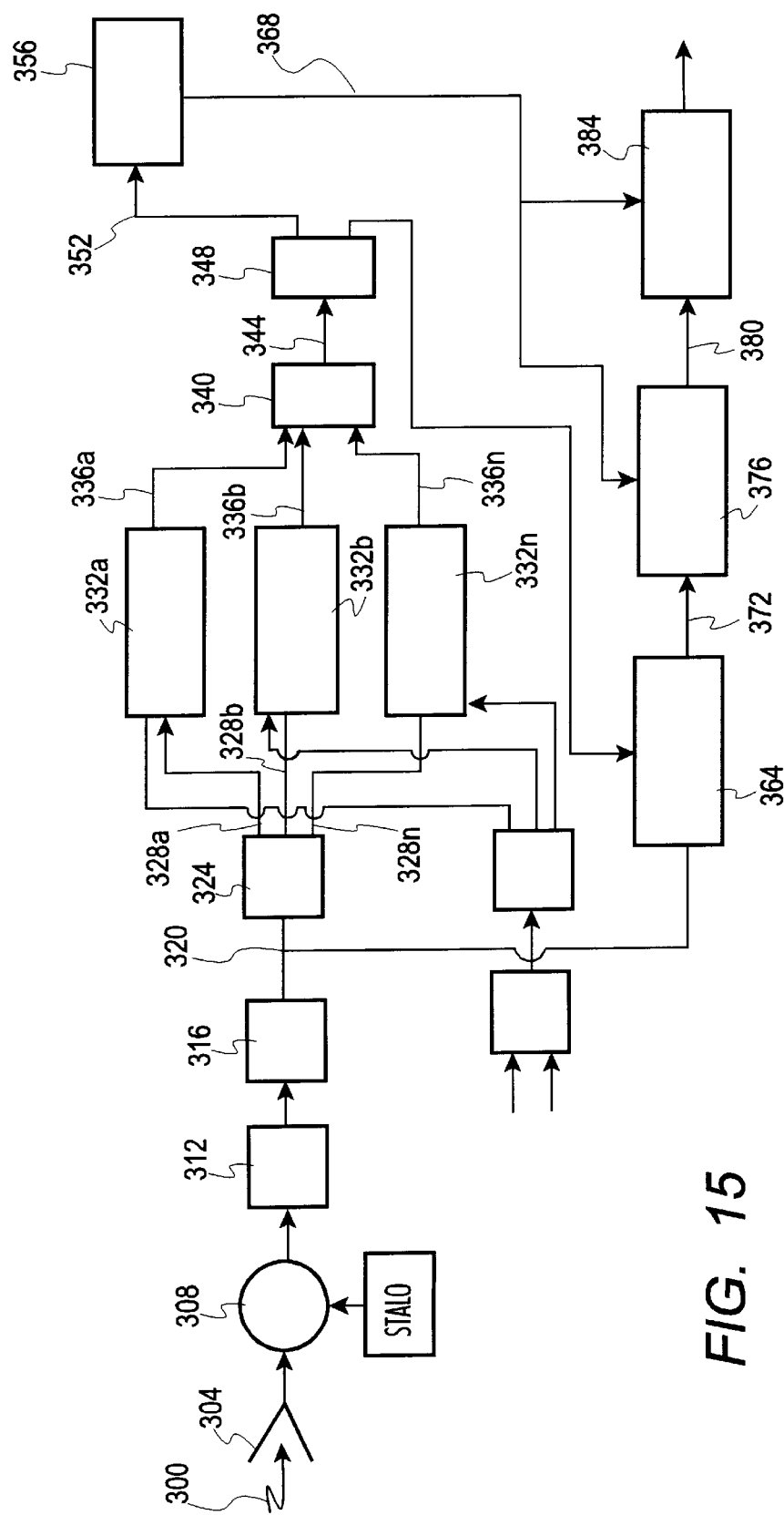
FIG. 15 depicts another embodiment of the present invention.
Figure 16:
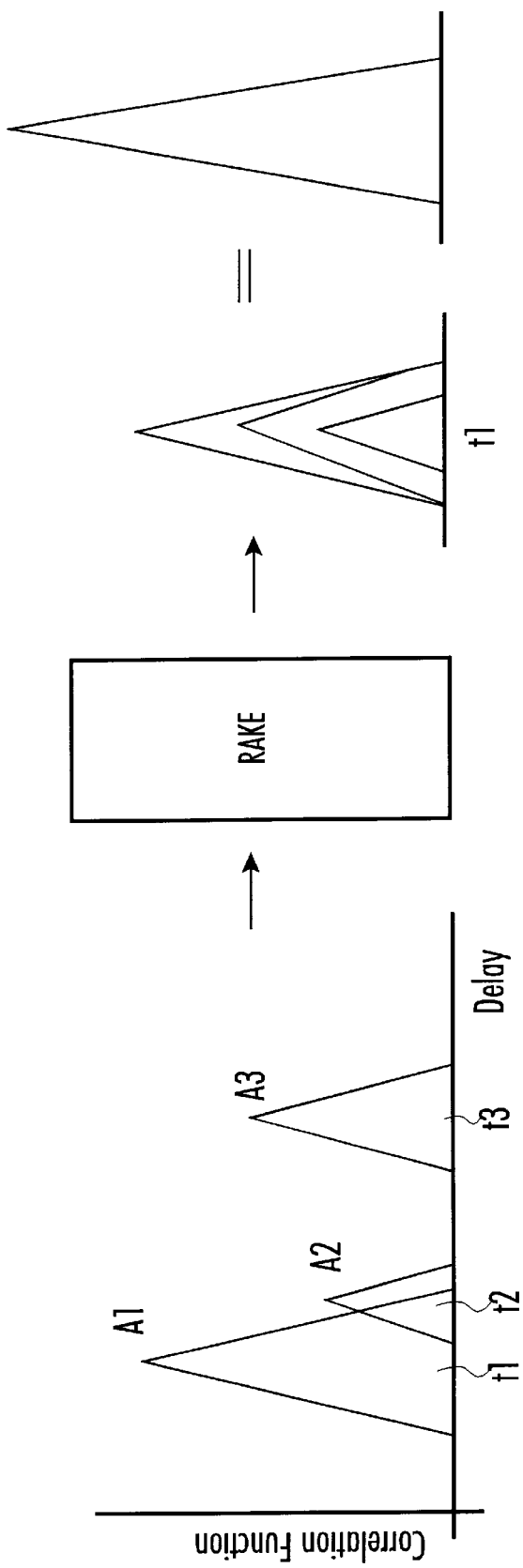
FIG. 16 depicts RAKE processing.

FIG. 15 depicts an embodiment of a signal processing architecture incorporating these features. Referring to FIG. 11, the signals 300 are received by one or more antennas 304, down converted by a down converter 308 to intermediate frequency, filtered by one or more filters 312, and passed through an analog-to-digital converter 316 to form a digital signal 320. The digital signal 320 is passed through an analysis filter bank 324 to generate a plurality of subband signals 328*a–n*, and the subband signals 328*a–n* to a plurality of subband correlators 332*a–n* as noted above to form a plurality of subband correlation signals 336*a–n*. The subband correlation signals 336*a–n* are passed to a synthesis filter bank 340 to form a correlation function 344 corresponding to the signal 300. The correlation function 344 is passed to a pre-detector 348 to determine an estimated transmit time and frequency and an amplitude and delay for each of the correlation peaks. The estimated transmit time and frequency 352 are provided to a code generator 356 and the amplitude and time delay 360 associated with each correlation peak are provided to the RAKE processor 364. The code generator 356 determines a replicated code 368 corresponding to the signal 300 based on the estimated trial time and frequency. Using the correlation peak amplitudes and time and/or phase delays, the RAKE processor 364, as shown in FIG. 16, shifts the input sequence y(k) by the amounts of the multipath time and/or phase delays and then weights each shifted version by the amplitude of the peak of the correlation function corresponding to that peak to form a RAKED signal 372 (denoted by $y_R(k)$). The RAKED sequence is commonly defined by the following mathematical equation:

$$y_R(k) = \frac{1}{\sum_{i=1}^{p} A_i} \sum_{i=1}^{p} A_i e^{-j\phi i} y(k + t_i)$$

where:
- p is the number of multipath signals (and therefore the number of peaks);
- $A_i$ is the amplitude of the $i^{th}$ peak;
- $t_i$ is the time delay of the $i^{th}$ peak;
- $\phi$ is the phase delay of the $i^{th}$ peak;
- y(k) is the input sequence into the code correlator.

The RAKED signal 372 and the replicated code 368 are correlated in a correlator 376 to provide the actual transmit time and frequency 380 which are then used by a detector 384 to detect the signal.

There are a number of variations of the above-described system. The variations are useful in specific applications, such as GPS, CDMA, and radar.

Figure 17:
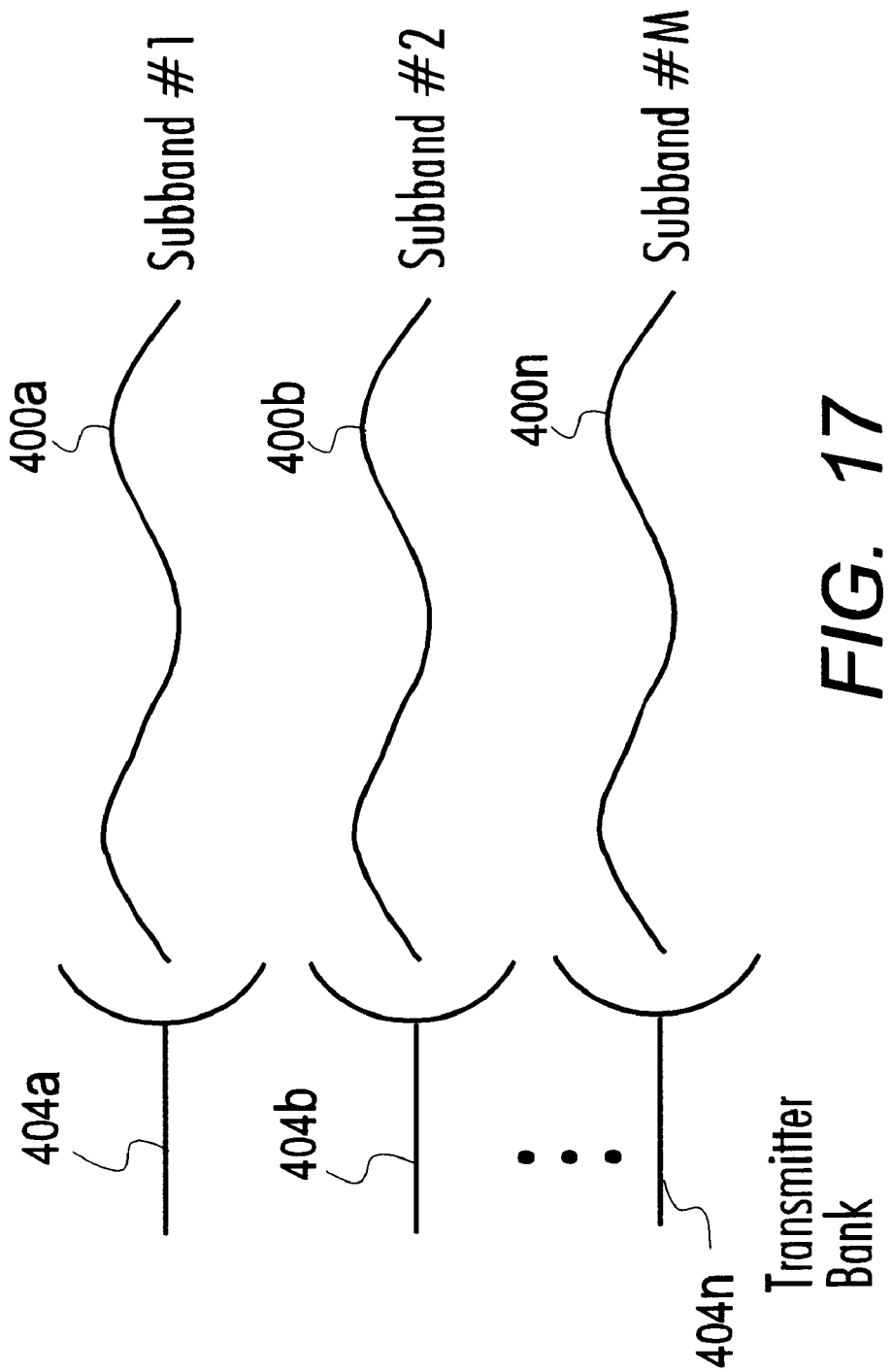
FIG. 17 depicts a multiplexed radar transmitter architecture.
Figure 18:
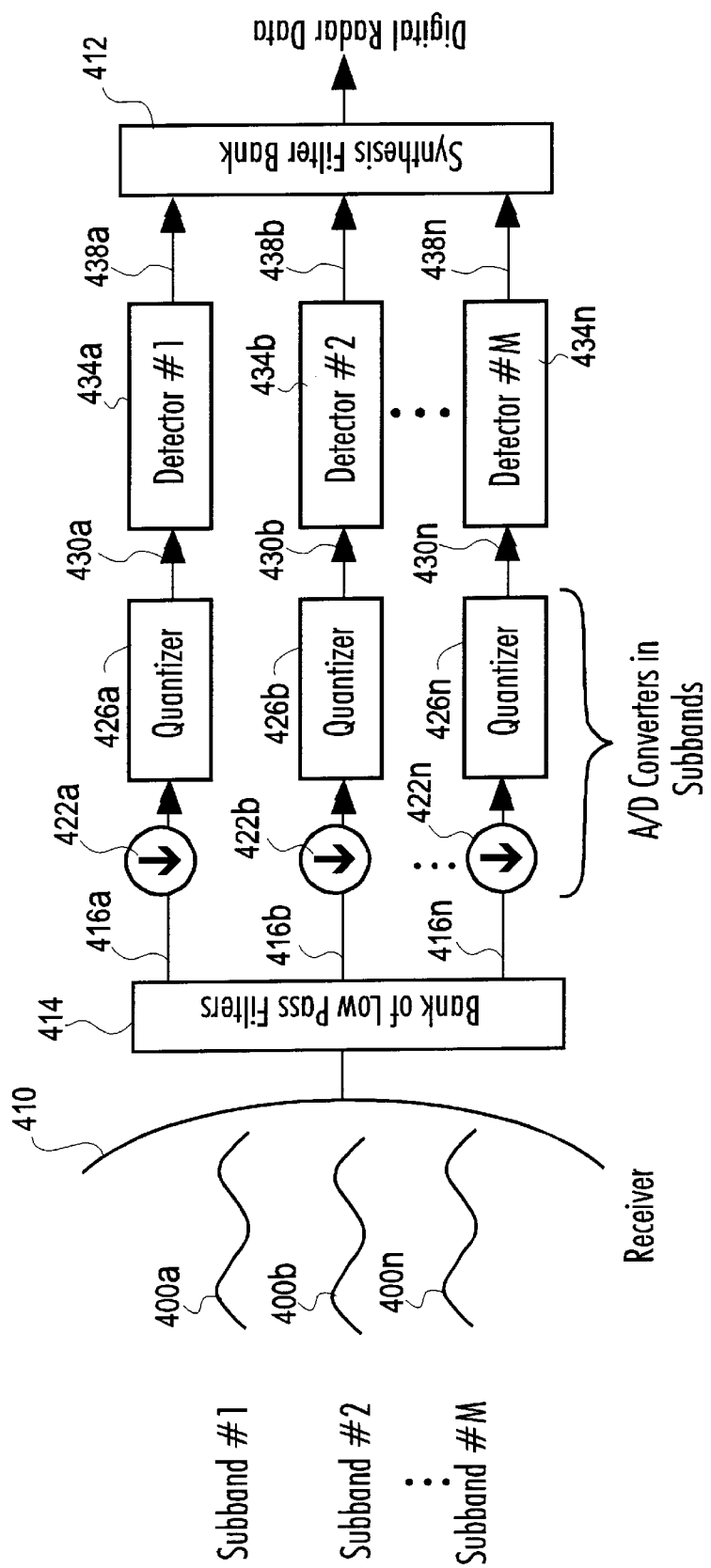
FIG. 18 depicts a radar receiver architecture.

In one variation of the system of FIG. 15 that is depicted in FIGS. 17–18, multiplexed radar transmitter and receiver architectures are depicted. The radar signals 400*a–n* are a number of coded waveforms that operate in separate, contiguous subbands (referred to as "radar subband signals"). As shown in FIG. 17, the radar signals 400*a–n* are simultaneously transmitted by a plurality of transmitters 404*a–n* that each include a plurality of analysis filters (not shown) to form the various radar subband signals 400*a–n*. Referring to FIG. 18, the various radar subband signals 400*a–n* are received by a signal receptor 410 and passed through a plurality of bandpass filters 414*a–n*. A bandpass filter 414*a–n* having unique bandpass characteristics corresponds to each of the radar subband signals. The various filtered subband signals 416*a–n* are sampled by a plurality of decimators 422*a–n* and quantized by a plurality of quantizers 426*a–n* to form digital subband signals 430*a–n*. The digital subband signals 430*a–n* are analyzed by a plurality of detectors 434*a–n* to form a corresponding plurality of detected signals 438*a–n*. The detectors 434*a–n* use a differently coded waveform for each of the transmitted radar subband signals 400*a–n* so that the subband radar signals can be individually separated upon reception. As noted above in FIGS. 14–15, the coded radar waveform is decomposed by a plurality of analysis filters (not shown) that are identical to the analysis filters in the receiver to provide replicated subband signals to the detectors 434*a–n*. Each detector 434*a–n* correlates a radar subband signal 430*a–n* with its corresponding replicated subband signal to form a plurality of corresponding detected signals 438*a–n*. The detected signals 438*a–n* are analyzed by a synthesis filter bank 412*a–n* to form a composite radar signal 446.

In a variation of the system of FIG. 15, a bank of analysis filters and synthesis filters can be implemented both directly before and after the correlation step (not shown) to provide the above-noted reductions in computational requirements.

In another variation of the system of FIG. 15, the analysis filters can be relocated before the analog-to-digital converter 316 to form the subband signals before as opposed to after conversion.

Figure 20:
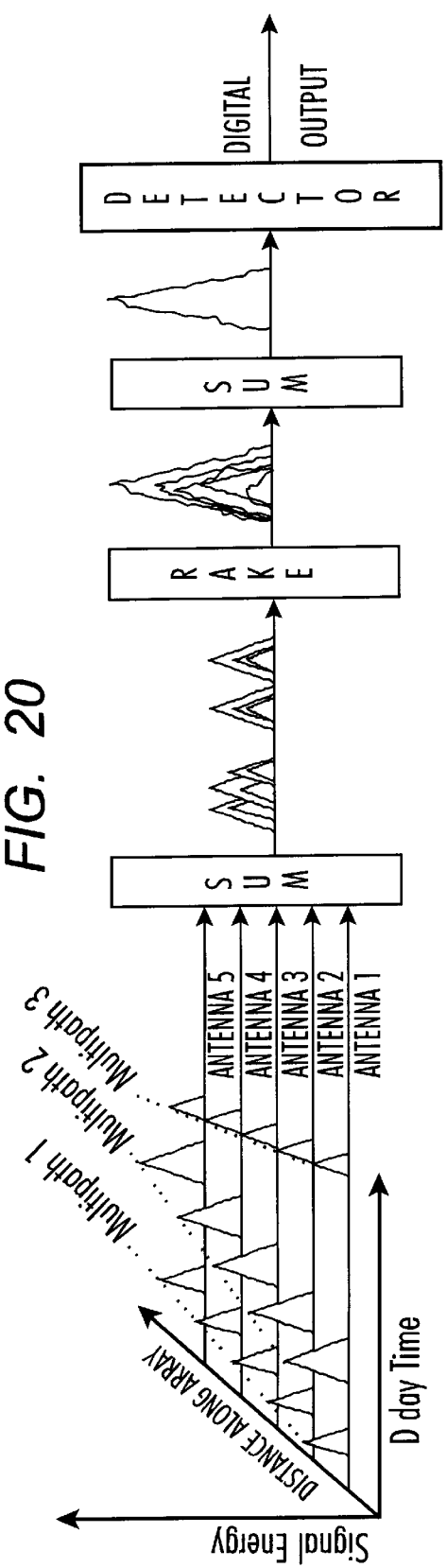
FIG. 20 depicts an alternative RAKE processing methodology.

In another variation shown of the system of FIG. 15 that is depicted in FIG. 20, the RAKE processor 364 can account for the relative delays in antenna outputs of the signal 300 (which is a function of the arrangement of the antennas as well as the angular location of the signal source) by summing the antenna outputs without compensating for the relative output delays. The correlation process may result in N×p peaks, where N is the number of antenna outputs and p is the number of multipath induced peaks. The Np peaks are then used to realign and scale the input data before summation. The RAKE 364 in effect has performed the phase-delay compensation usually done in beam-steering. The advantages of this approach compared to conventional beam steering techniques include that it is independent of antenna array geometries and steering vectors, it does not require iterative searches for directions as in LMS and its variants, and it is computationally very efficient. This approach is discussed in detail in copending application having Ser. No. 08/916,884, and filed on Aug. 21, 1997.

While various embodiments of the present invention have been described in detail, it is apparent that modifications and adaptations of those embodiments will occur to those skilled in the art. However, it is to be expressly understood that such modifications and adaptations are within the scope of the present invention, as set forth in the following claims.

What is claimed is:

1. A method for acquiring a signal having a bandwidth, comprising:
    decomposing the signal into n signal segments, each signal segment having a signal segment bandwidth that is less than the signal bandwidth;
    processing y of the n signal segments to form a plurality of processed signal segments, wherein y is less than n; and
    combining the processed signal segments into a composite signal wherein the signal is one of analog or digital and the composite signal is the other one of analog or digital.

2. The method of claim 1, wherein the processing step comprises:
    correlating the plurality of y signal segments with a corresponding plurality of replicated signal segments to provide a corresponding plurality of correlation functions.

3. The method of claim 2, wherein the processing step comprises:
    determining an amplitude, time delay, and phase delay for at least a portion of a plurality of peaks defined by the plurality of correlation functions and
    realigning and scaling at least a portion of the signal defined by the signal segments based on one or more of the amplitude, time delay, and phase delay for the at least a portion of the plurality of peaks.

4. The method of claim 1, wherein the processing step includes performing analog-to-digital conversion of each of the y signal segments.

5. The method of claim 1, wherein the processing step includes performing digital-to-analog conversion of each of the y signal segments.

6. The method of claim 1, wherein the processing step includes removing a noise component from each of the y signal segments to form a corresponding plurality of noise reduced signal segments and thereafter converting each of the noise reduced signal segments from one of analog or digital format to the other of analog or digital format.

7. The method of claim 1, wherein in the processing step each of the y signal segments is processed separately.

8. The method of claim 1, wherein the composite signal has the same bandwidth as the signal bandwidth.

9. The method of claim 1, wherein the composite signal is a time delayed replica of the signal.

10. The method of claim 1, wherein the signal has a bandwidth of at least about 1 GHz.

11. The method of claim 1, wherein the sum of the plurality of signal segment bandwidths is equivalent to the signal bandwidth.

12. The method of claim 1, wherein the signal is in one of analog or digital format and the composite signal is in the other of analog or digital format.

13. The method of claim 1, wherein the processing step comprises:
    assigning boundary values to a plurality of bins;
    sampling a signal segment to provide a sampled value corresponding to the sampled portion of the signal segment;
    comparing the sampled value with assigned boundary values for each of the plurality of bins;
    selecting an appropriate bin for the sampled portion of the signal segment;
    thereafter reassigning new boundary values to at least a portion of the plurality of bins; and
    repeating the assigning, sampling, comparing and selecting steps.

14. The method of claim 1, wherein the processing step includes the step of:
    eliminating any of the n signal segments having a signal-to-noise ratio of less than one to form the y signal segments.

15. The method of claim 1 wherein n-y of the signal segments are not processed in the processing step.

16. An apparatus for acquiring a signal having a signal bandwidth, comprising:
    means for receiving a signal in the form of a pseudorandom or random waveform having a signal bandwidth;
    means for decomposing the signal into n signal segments, each signal segment having a signal segment bandwidth that is less than the signal bandwidth;
    means for processing y of the signal segments to form a plurality of processed signal segments, wherein y is less than n; and
    means for combining the processed signal segments into a composite signal wherein the signal is one of analog or digital and the composite signal is the other one of analog or digital.

17. The apparatus of claim 16, wherein the means for processing includes means for performing analog-to-digital conversion of each of the y signal segments.

18. The apparatus of claim 16, wherein the means for processing includes means for performing digital-to-analog conversion of each of the signal segments.

19. The apparatus of claim 16, wherein the means for decomposing is a plurality of low pass filters.

20. The apparatus of claim 16, wherein the means for decomposing includes a plurality of analysis filters and the means for combining includes a plurality of synthesis filters.

21. The apparatus of claim 16, wherein the means for combining is a perfect reconstruction filter bank.

22. The apparatus of claim 16, wherein the means for processing includes at least one of a plurality of analog-to-digital converters and a plurality of digital-to-analog converters.

23. The apparatus of claim 16, wherein the means for processing includes a noise rejecting quantizer.

24. The apparatus of claim 16, wherein the processing means includes means for rejecting any of the n signal segments having a signal-to-noise ratio of less than one to form the y signal segments.

25. The apparatus wherein n-y of the signal segments are not processed by the processing means.

26. A method for forming a composite signal having a composite bandwidth from a first plurality of signal segments, the frequency band of the composite signal including each of the signal segments, the method comprising:

eliminating from the first plurality of signal segments any signal segment in which a noise component exceeds a signal component to form a second plurality of signal segments, the second plurality of signal segments being less than the first plurality of signal segments; and performing synthesis filtering on each of the second plurality of signal segments to form the composite signal.

27. The method of claim 26, further comprising:

emitting the first plurality of signal segments from a plurality of signal sources and receiving each of the first plurality of signal segments using a corresponding plurality of signal receptors.

28. The method of claim 26, further comprising:

converting each of the second plurality of signal segments from an analog format to a digital format.

29. A system for forming a composite signal having a composite bandwidth from a first plurality of signal segments, the composite bandwidth including the frequency range of each of the signal segments, the system comprising:

means for rejecting any of the first plurality of signal segments in which a noise component exceeds a signal component to form a second plurality of signal segments; and means for performing synthesis filtering on each of the second plurality of signal segments to form the composite signal.

30. The system of claim 29, further comprising:

means for emitting the first plurality of signal segments and means for receiving each of the first plurality of signal segments.

31. The system of claim 29, further comprising:

means for converting each of the second plurality of signal segments from an analog format to a digital format.

32. The system of claim 29, further comprising:

a plurality of analysis filters to decompose a source signal into the first plurality of signal segments;

a plurality of digital-to-analog conversion devices for converting the second plurality of decomposed signal segments from digital into analog format to form a corresponding plurality of analog signal segments;

a plurality of amplifiers to form a corresponding plurality of amplified analog signal segments;

a plurality of signal emitters for emitting the plurality of amplified analog signal segments; and a plurality of receptors for receiving, from the plurality of signal emitters, the plurality of amplified analog signal segments.

33. The system of claim 29, further comprising:

a plurality of analysis filters to decompose a source signal into the first plurality of signal segments;

a plurality of amplifiers to amplify the second plurality of signal segments to form a corresponding plurality of amplified signal segments;

a plurality of signal emitters for emitting the plurality of amplified signal segments; and a plurality of receptors for receiving the plurality of amplified signal segments.

34. The system of claim 29, further comprising:

a plurality of receptors for receiving the first plurality of signal segments;

a plurality of analog-to-digital converters to convert the second plurality of signal segments into a plurality of digital signal segments.

35. The system of claim 29, wherein the number of the first plurality of signal segments is more than the number of the second plurality of signal segments.

36. A method for processing an analog signal having a bandwidth, comprising:

decomposing the analog signal into a first plurality of analog signal segments, each analog signal segment having a signal segment bandwidth that is less than the signal bandwidth;

rejecting any of the analog signal segments in which the signal-to-noise ratio is less than one to form a second plurality of analog signal segments; and processing each of the second plurality of analog signal segments to form a plurality of processed analog signal segments; and combining the processed analog signal segments into a composite signal.

37. The method of claim 36, wherein the number of the first plurality of signal segments is more than the number of the second plurality of signal segments.

* * * * *

UNITED STATES PATENT AND TRADEMARK OFFICE
CERTIFICATE OF CORRECTION

| | |
|---|---|
| PATENT NO. | : 6,252,535 B1 |
| DATED | : June 26, 2001 |
| INVENTOR(S) | : Kober et al. |

It is certified that error appears in the above-identified patent and that said Letters Patent is hereby corrected as shown below:

Drawings,
Sheet 8, Fig. 12 is deleted and replaced with the following:

Signed and Sealed this

Twenty-third Day of April, 2002

*Attest:*

JAMES E. ROGAN
*Attesting Officer*     *Director of the United States Patent and Trademark Office*